(12) United States Patent
Kinoshita et al.

(10) Patent No.: US 8,017,715 B2
(45) Date of Patent: Sep. 13, 2011

(54) POLYESTER, AND COMPOSITION AND FILM COMPRISING THE SAME

(75) Inventors: Eiji Kinoshita, Anpachi-gun (JP);
Tomoyuki Kishino, Matsuyama (JP);
Kazuteru Kohno, Iwakuni (JP);
Tatsuya Ogawa, Matsuyama (JP)

(73) Assignee: Teijin Limited, Osaka (JP)

( * ) Notice: Subject to any disclaimer, the term of this patent is extended or adjusted under 35 U.S.C. 154(b) by 217 days.

(21) Appl. No.: 12/524,214

(22) PCT Filed: Jan. 18, 2008

(86) PCT No.: PCT/JP2008/051023
§ 371 (c)(1),
(2), (4) Date: Jul. 23, 2009

(87) PCT Pub. No.: WO2008/096612
PCT Pub. Date: Aug. 14, 2008

(65) Prior Publication Data
US 2010/0120967 A1    May 13, 2010

(30) Foreign Application Priority Data

| Feb. 5, 2007 | (JP) | 2007-025455 |
| Feb. 5, 2007 | (JP) | 2007-025456 |
| Feb. 5, 2007 | (JP) | 2007-025457 |
| Jul. 2, 2007 | (JP) | 2007-173801 |

(51) Int. Cl.
C08G 63/02 (2006.01)
C08G 64/00 (2006.01)

(52) U.S. Cl. ...... 528/209; 428/411.1; 428/412; 528/176; 528/271; 528/272

(58) Field of Classification Search ...... 428/411.1, 428/412; 528/176, 209, 271, 272
See application file for complete search history.

(56) References Cited

U.S. PATENT DOCUMENTS

| 4,581,420 A | 4/1986 | Smith |
| 4,581,438 A | 4/1986 | Inata et al. |
| 7,582,369 B2 | 9/2009 | Kobayashi et al. |
| 2007/0172682 A1 | 7/2007 | Kobayashi et al. |

FOREIGN PATENT DOCUMENTS

| EP | 1734067 A1 | 12/2006 |
| JP | 60-135428 A | 7/1985 |
| JP | 60-221420 A | 11/1985 |
| JP | 61-143425 A | 7/1986 |
| JP | 61-145724 A | 7/1986 |
| JP | 6-145323 A | 5/1994 |
| JP | 8-109318 A | 4/1996 |

OTHER PUBLICATIONS

European Search Report dated Jan. 25, 2010, issued in corresponding European Patent Application No. 08703850.1.
Notification of Transmittal of Translation of the International Preliminary Report on Patentability (Forms PCT/IB/338) of International Application No. PCT/JP2008/051023 mailed Aug. 20, 2009 with Forms PCT/IB/373 and PCT/ISA/237.
International Search Report of PCT/JP2008/051023, Mailing Date of Feb. 26, 2008.

Primary Examiner — Terressa M Boykin
(74) Attorney, Agent, or Firm — Westerman, Hattori, Daniels & Adrian, LLP

(57) ABSTRACT

An object of the present invention is to provide a polyester film having excellent dimensional stability to temperature and humidity.
The present invention is a polyester containing a dicarboxylic acid component and a diol component, wherein
  (i) the dicarboxylic acid component contains not less than 5 mol % and less than 50 mol % of a recurring unit represented by the following formula (A) and more than 50 mol % and not more than 95 mol % of a recurring unit represented by the following formula (B):

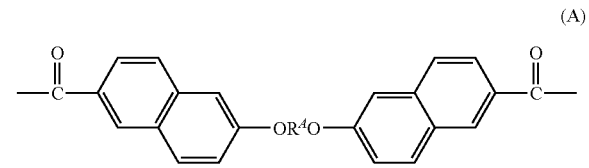

(A)

wherein $R^A$ is an alkylene group having 2 to 10 carbon atoms,

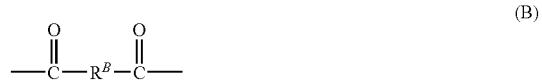

(B)

wherein $R^B$ is a phenylene group or naphthalenediyl group; and
  (ii) the diol component contains 90 to 100 mol % of a recurring unit represented by the following formula (C):

—O—$R^C$—O—    (C)

wherein $R^C$ is an alkylene group having 2 to 10 carbon atoms, and a film comprising the same.

25 Claims, 4 Drawing Sheets

US 8,017,715 B2

POLYESTER, AND COMPOSITION AND FILM COMPRISING THE SAME

TECHNICAL FIELD

The present invention relates to a polyester obtained by copolymerizing 6,6'-(alkylenedioxy) di-2-naphthoic acid, and a composition and a film comprising the same.

BACKGROUND OF THE ART

Aromatic polyesters typified by polyethylene terephthalate and polyethylene-2,6-naphthalene dicarboxylate are widely used in films because they have excellent mechanical properties, dimensional stability and heat resistance. Especially polyethylene-2,6-naphthalene dicarboxylate has more excellent mechanical properties, dimensional stability and heat resistance than polyethylene terephthalate and are used in fields in which these requirements are severe, for example, base films for high-density magnetic recording media. However, the requirement for dimensional stability in the high-density magnetic recording media is becoming higher and higher and the further improvement of the characteristic properties is desired.

Meanwhile, Patent Documents 1 to 4 propose polyesters comprising an ester unit of 6,6'-(ethylenedioxy)di-2-naphthoic acid as the main acid component and a diol component. These documents disclose crystalline polyesters having a melting point of 294° C.

However, the polyesters disclosed by these documents have a very high melting point and very high crystallinity. Therefore, when these polyesters are to be molded into a film, as they have low fluidity in a molten state, extrusion may become nonuniform, or when they are to be stretched after they are extruded, crystallization proceeds, whereby their films may be broken when they are stretched at a high draw ratio.

Patent Document 3 discloses a flexible disk made of a polyester comprising an ester unit of 6,6'-(ethylenedioxy)di-2-naphthoic acid as the main acid component and a diol component. It is disclosed that this flexible disk has a maximum temperature expansion coefficient ($\alpha t$) of 10 to 35 ($\times 10^{-6}/°$ C.), a maximum humidity expansion coefficient ($\alpha h$) of 0 to 8.0 ($\times 10^{-6}/\%$ RH), a difference between the maximum and minimum temperature expansion coefficients ($\alpha t$) of 0 to 6.0 ($\times 10^{-6}/°$ C.) and a difference between the maximum and minimum humidity expansion coefficients ($\alpha h$) of 0 to 4.0 ($\times 10^{-6}/\%$ RH).

In an Example of the above document, there is disclosed a film having a maximum temperature expansion coefficient ($\alpha t$) of 19 ($\times 10^{-6}/°$ C.), a minimum temperature expansion coefficient ($\alpha t$) of 16.5 ($\times 10^{-6}/°$ C.), a maximum humidity expansion coefficient ($\alpha h$) of 6 ($\times 10^{-6}/\%$ RH), and a minimum humidity expansion coefficient ($\alpha h$) of 4.5 ($\times 10^{-6}/\%$ RH).

However, the requirement for the improvement of recording density in magnetic recording media is now severe, and dimensional stability required for a base film cannot be attained not only by polyethylene terephthalate but also by polyethylene-2,6-naphthalene dicarboxylate and the film proposed by Patent Document 3.
(Patent Document 1) JP-A 60-135428
(Patent Document 2) JP-A 60-221420
(Patent Document 3) JP-A 61-145724
(Patent Document 4) JP-A 6-145323

DISCLOSURE OF THE INVENTION

It is an object of the present invention to provide a polyester which can provide a film having excellent dimensional stability.

It is another object of the present invention to provide a polyester film having excellent dimensional stability, especially dimensional stability to environmental variations such as temperature and humidity variations.

In the polyester film, the temperature expansion coefficient ($\alpha t$) and the humidity expansion coefficient ($\alpha h$) have close relationship with the Young's modulus. In general, as the Young's modulus is higher, $\alpha t$ and $\alpha h$ become lower. However, the Young's modulus cannot be increased indefinitely and there is limitation to the Young's modulus from the viewpoints of securing film forming properties and Young's modulus in the orthogonal direction.

A film made of a polyester comprising 6,6'-(alkylenedioxy)di-2-naphthoic acid (may be abbreviated as ANA hereinafter) as the main dicarboxylic acid component shows low $\alpha h$ regardless of the Young's modulus but has very high $\alpha t$. The film disclosed in Example 1 of the Patent Document 3 has a maximum $\alpha t$ of 19 ($\times 10^{-6}/°$ C.) and a minimum $\alpha t$ of 16.5 ($\times 10^{-6}/°$ C.). That is, the film shows very high $\alpha t$ regardless of its Young's modulus.

Then, the inventors of the present invention conducted intensive studies to provide a film having low $\alpha t$ and low $\alpha h$. As a result, they found that a polyester obtained by copolymerizing a predetermined amount of ANA with a polyester comprising terephthalic acid or naphthalenedicarboxylic acid as a dicarboxylic acid component has excellent film forming properties and that a film having a good appearance and excellent mechanical strength is obtained from the copolyester. They also found that the obtained film has low $\alpha h$ which is one of the characteristic properties of ANA and also low $\alpha t$. The present invention has been accomplished based on these findings.

That is, the present invention is a polyester containing a dicarboxylic acid component and a diol component, wherein
(i) the dicarboxylic acid component contains not less than 5 mol % and less than 50 mol % of a recurring unit represented by the following formula (A) and more than 50 mol % and not more than 95 mol % of a recurring unit represented by the following formula (B):

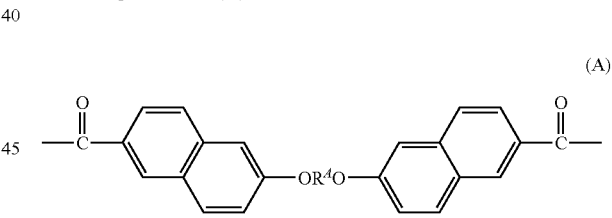

wherein $R^A$ is an alkylene group having 2 to 10 carbon atoms,

wherein $R^B$ is a phenylene group or naphthalenediyl group; and
(ii) the diol component contains 90 to 100 mol % of a recurring unit represented by the following formula (C):

wherein $R^C$ is an alkylene group having 2 to 10 carbon atoms.

The present invention includes a film comprising the above polyester. Further, the present invention includes a composition comprising the above polyester and particles having an average particle diameter of 0.05 to 5 μm.

BEST MODE FOR CARRYING OUT THE INVENTION

[Polyester]

Figure 1:
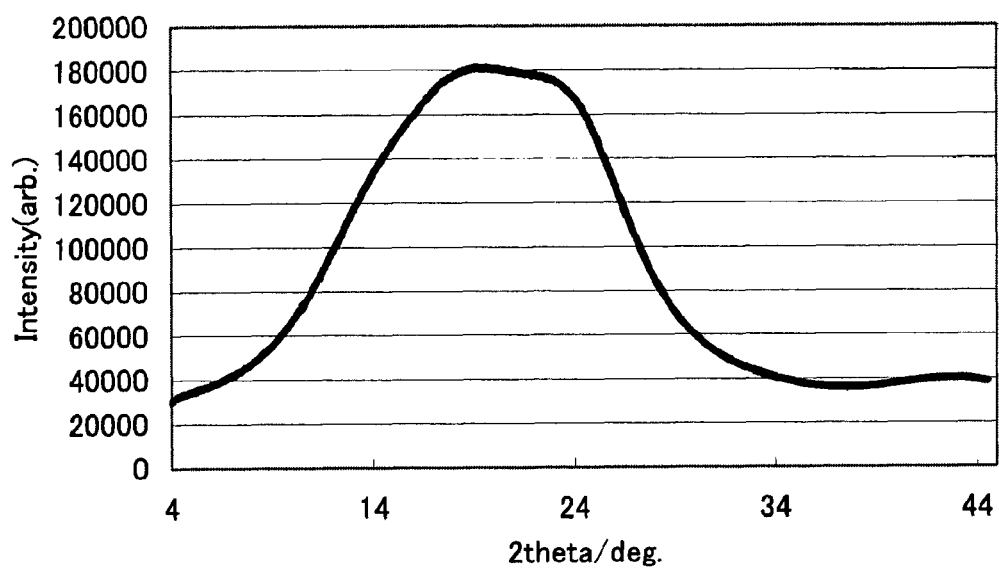
FIG. 1 is an XRD measurement chart of copolyethylene-2,6-naphthalate in Example 33.

The polyester of the present invention contains a dicarboxylic acid component and a diol component.

[Dicarboxylic Acid Component]

The dicarboxylic acid component contains not less than 5 mol % and less than 50 mol % of a recurring unit represented by the following formula (A) and more than 50 mol % and not more than 95 mol % of a recurring unit represented by the following formula (B).

(formula (A))

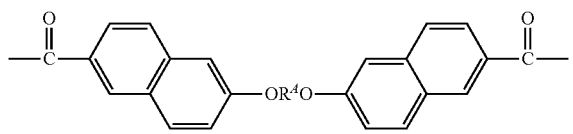

(A)

In the above formula (A), $R^A$ is an alkylene group having 2 to 10 carbon atoms. Examples of the alkylene group include ethylene group, propylene group, isopropylene group, trimethylene group, tetramethylene group, hexamethylene group and octamethylene group.

The upper limit of the content of the recurring unit represented by the formula (A) is preferably 45 mol %, more preferably 40 mol %, much more preferably 35 mol %, particularly preferably 30 mol %. The lower limit is preferably 5 mol %, more preferably 7 mol %, much more preferably 10 mol %, particularly preferably 15 mol %. Therefore, the content of the recurring unit represented by the formula (A) is preferably 5 to 45 mol %, more preferably 7 to 40 mol %, much more preferably 10 to 35 mol %, particularly preferably 15 to 30 mol %.

The recurring unit represented by the formula (A) is preferably a unit derived from 6,6'-(ethylenedioxy)di-2-naphthoic acid, 6,6'-(trimethylenedioxy)di-2-naphthoic acid or 6,6'-(butylenedioxy)di-2-naphthoic acid. Out of these, the recurring unit is preferably a unit of the formula (A) in which the number of carbon atoms of $R^A$ is even, particularly preferably a unit derived from 6,6'-(ethylenedioxy)di-2-naphthoic acid.

The polyester of the present invention is characterized in that its dicarboxylic acid component contains not less than 5 mol % and less than 50 mol %, of a unit represented by the formula (A). When the content of the unit represented by the formula (A) falls below the lower limit, the effect of reducing the humidity expansion coefficient (αh) by copolymerization is hardly obtained. However, the temperature expansion coefficient (αt) can be easily reduced by making the content of the unit lower than the upper limit. The effect of reducing the humidity expansion coefficient (αh) by the unit represented by the formula (A) is obtained very efficiently with a small amount of the polyester. By using a polyester containing a recurring unit represented by the formula (A), a molded article, for example, a film having a low temperature expansion coefficient (αt) and a low humidity expansion coefficient (αh) can be manufactured.

(formula (B))

(B)

In the formula (B), $R^B$ is a phenylene group or naphthalenediyl group. Examples of the recurring unit represented by the formula (B) include units derived from terephthalic acid, isophthalic acid, 2,6-naphthalenedicarboxylic acid and 2,7-naphthalenedicarboxylic acid, and combinations thereof.

[Diol Component]

(Formula (C))

The diol component contains 90 to 100 mol % of a recurring unit represented by the following formula (C). The content of the recurring unit represented by the formula (C) is preferably 95 to 100 mol %, more preferably 98 to 100 mol %.

(C)

In the formula (C), $R^C$ is an alkylene group having 2 to 10 carbon atoms. Examples of the alkylene group represented by $R^C$ include ethylene group, propylene group, isopropylene group, trimethylene group, tetramethylene group, hexamethylene group and octamethylene group. Out of these, units derived from ethylene glycol, trimethylene glycol, tetramethylene glycol and cyclohexane dimethanol are preferred as the diol component represented by the formula (C). The content of the unit derived from ethylene glycol as a diol component is preferably not less than 90 mol %, more preferably 90 to 100 mol %, much more preferably 95 to 100 mol %, the most preferably 98 to 100 mol %.

The diol component may contain another diol component except for the diol component represented by the formula (C). The content of the another diol component is preferably 0 to 10 mol %, more preferably 0 to 5 mol %, much more preferably 0 to 2 mol %. Examples of the another dial component are those enumerated for the diol component of the formula (C). For example, when the dial component of the formula (C) is a unit derived from ethylene glycol, another diol component is a unit except for the unit derived from ethylene glycol.

The content of the ester unit (-(A)-(C)-) consisting of the recurring unit represented by the formula (A) and the recurring unit represented by the formula (C) is preferably not less than 5 mol % and less than 50 mol %, more preferably 5 to 45 mol %, much more preferably 10 to 40 mol % of all the recurring unit.

Preferred examples of the another ester unit include polyalkylene terephthalate units such as polyethylene terephthalate, polytrimethylene terephthalate and polybutylene terephthalate, and polyalkylene-2,6-naphthalene dicarboxylate units such as polyethylene-2,6-naphthalene dicarboxylate, polytrimethylene-2,6-naphthalene dicarboxylate and polybutylene-2,6-naphthalene dicarboxylate. Out of these, ethylene terephthalate units and ethylene-2,6-naphthalene dicarboxylate units are preferred and the ethylene-2,6-naphthalene dicarboxylate unit is particularly preferred from the viewpoint of mechanical properties.

Therefore, a polyester containing a recurring unit represented by the following formula (A-1) as the recurring unit represented by the formula (A) is preferred.

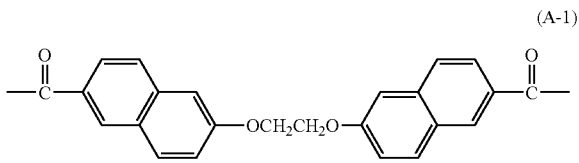

(A-1)

A polyester containing a dicarboxylic acid component which comprises 10 to 40 mol % of a recurring unit represented by the formula (A) and 90 to 60 mol % of a recurring unit represented by the following formula (B-1) is preferred.

(B-1)

A polyester containing a dicarboxylic acid component which comprises 5 to 45 mol % of a recurring unit represented by the formula (A) and 95 to 55 mol % of a recurring unit represented by the following formula (B-2) is also preferred.

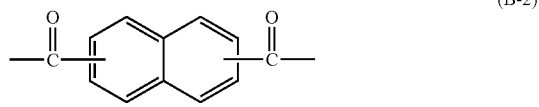

(B-2)

The polyester of the present invention has an intrinsic viscosity measured at 35° C. by using a mixed solvent of p-chlorophenol and 1,1,2,2-tetrachloroethane (weight ratio of 40/60) of 0.4 to 3 dl/g, preferably 0.4 to 1.5 dl/g, more preferably 0.5 to 1.2 dl/g.

The melting point of the polyester of the present invention is 200 to 260° C., preferably 205 to 255° C., more preferably 210 to 250° C. The melting point is measured by DSC. When the melting point exceeds the upper limit and the polyester is molded by melt extrusion, fluidity deteriorates with the result that delivery is apt to become nonuniform. When the melting point falls below the lower limit, though film forming properties are excellent, the mechanical properties of the polyester are apt to be impaired.

In general, a copolymer has a lower melting point and lower mechanical strength than a homopolymer. However, the polyester of the present invention is a copolymer containing a unit of the formula (A) and a unit of the formula (B) and has almost the same mechanical strength as a homopolymer having a unit of the formula (A) though it has a lower melting point than the homopolymer.

The glass transition temperature (may be referred to as "Tg" hereinafter) measured by DSC of the polyester of the present invention is preferably 80 to 120° C., more preferably 82 to 118° C., much more preferably 85 to 118° C. When Tg falls within this range, a film having excellent heat resistance and dimensional stability is obtained. The melting point and the glass transition temperature can be adjusted by controlling the type and amount of a comonomer and the production of a dialkylene glycol as a by-product.

In the polyester of the present invention, the content of a recurring unit represented by the following formula (E) is preferably not more than 5 mol %, more preferably not more than 3 mol %, much more preferably not more than 2 mol % based on the total number of moles of all the diol components.

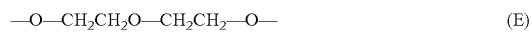

—O—CH$_2$CH$_2$O—CH$_2$CH$_2$—O— (E)

When the recurring unit represented by the formula (E) is contained in the polymer skeleton, the stiffness of the main chain is lost and the recurring unit causes the deterioration of mechanical properties and heat resistance. The recurring unit represented by the formula (E) is formed by a reaction between glycol components or a reaction between hydroxyl terminals at the terminals of the polymer. The content of the recurring unit represented by the formula (E) can be measured by a nuclear magnetic resonance apparatus.

The terminal carboxy group concentration of the polyester of the present invention is preferably not more than 200 eq/ton, more preferably 0.1 to 150 eq/ton, much more preferably 0.1 to 100 eq/ton.

The polyester of the present invention has an alkali metal content of preferably not more than 300 ppm.

The polyester of the present invention may be copolymerized with another comonomer known per se or blended with a polyether imide or liquid crystalline resin in limits that do not impair the effect of the present invention.

[Method of Manufacturing Polyester]

The polyester of the present invention can be manufactured by the following method. For example, a dicarboxylic acid component containing 6,6'-(alkylenedioxy)di-2-naphthoic acid (may be abbreviated as ANA hereinafter) and naphthalenedicarboxylic acid, terephthalic acid or an ester forming derivative thereof and a diol component such as ethylene glycol are reacted with each other to produce a polyester precursor. The polyester can be manufactured by polymerizing the obtained polyester precursor in the presence of a polymerization catalyst. Thereafter, solid-phase polymerization may be carried out as required.

The aromatic polyester of the present invention can be manufactured through (i) the first step of obtaining a polyester precursor by reacting a dicarboxylic acid component with a diol component and (ii) the second step of polymerizing the polyester precursor in the presence of a polymerization catalyst.

[First Step]

The first step is to obtain a polyester precursor by reacting a dicarboxylic acid component with a diol component.

(Dicarboxylic Acid Component)

The dicarboxylic acid component contains a compound represented by the following formula (a).

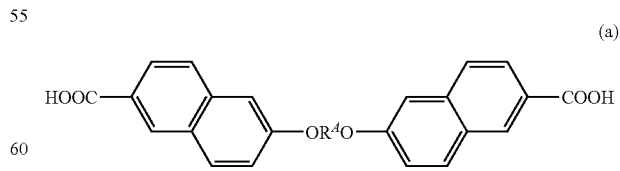

(a)

In the above formula, $R^4$ is an alkylene group having 2 to 10 carbon atoms. Examples of the alkylene group include ethylene group, isopropylene group, trimethylene group, tetramethylene group, hexamethylene group and octamethylene group.

The content of the compound represented by the formula (a) in the dicarboxylic acid component is not less than 5 mol % and less than 50 mol %, preferably 5 to 45 mol %, more preferably 10 to 40 mol %.

Since an alkali metal is used to manufacture the compound represented by the formula (a), the compound contains the alkali metal as an impurity. When the aromatic polyester contains the alkali metal, its color becomes worse. Therefore, it is preferred to reduce the amount of the alkali metal in the compound represented by the formula (a) as a raw material.

The amount of the alkali metal can be reduced by the following methods. For example, after the compound represented by the formula (a) is changed into an amine salt or ammonium salt, the amount of the alkali metal can be reduced by decomposing the salt by acid deposition or heating. The amount of the alkali metal can also be reduced by acid depositing the compound represented by the formula (a) in the presence of a water-soluble organic solvent such as ethanol. Further, the amount of the alkali metal can be reduced by suspending the compound represented by the formula (a) in water, reacting it at 80 to 300° C. and repeating the operation of acid deposition.

The content of the alkali metal in the compound represented by the formula (a) as the raw material is preferably 5 to 200 ppm, more preferably 5 to 100 ppm, much more preferably 5 to 50 ppm.

The dicarboxylic acid component contains a compound represented by the following formula (b). The content of the compound represented by the formula (b) is more than 50 mol % and not more than 95 mol %.

(b)

In the formula (b), $R^B$ is a phenylene group or naphthalenediyl group. Examples of the compound represented by the formula (b) include terephthalic acid, isophthalic acid, 2,6-naphthalenedicarboxylic acid, 2,7-naphtahlenedicarboxylic acid and mixtures thereof.

(Diol Component)

The diol component contains a compound represented by the following formula (c).

(c)

The content of the compound represented by the formula (c) is 90 to 100 mol %, preferably 95 to 100 mol %, more preferably 98 to 100 mol %.

In the formula (c), $R^C$ is an alkylene group having 2 to 10 carbon atoms. Examples of the alkylene group represented by $R^C$ include ethylene group, propylene group, isopropylene group, trimethylene group, tetramethylene group, hexamethylene group and octamethylene group. The recurring unit represented by the formula (c) is a unit derived from ethylene glycol, trimethylene glycol, tetramethylene glycol or cyclohexane dimethanol.

The content of the unit derived from ethylene glycol in the diol component is preferably not less than 90 mol %, more preferably 90 to 100 mol %, much more preferably 95 to 100 mol %.

The diol component may contain another diol component except for the compound represented by the formula (c). The content of the another diol component is preferably 0 to 10 mol %, more preferably 0 to 5 mol %, much more preferably 0 to 2 mol %. Examples of the another diol component are those enumerated for the diol component of the formula (C). For example, when the diol component of the formula (C) is ethylene glycol, the another diol component is a diol component except for ethylene glycol.

To manufacture an aromatic polyester, another comonomer may be used in limits that do not impair the object and effect of the present invention in addition to the dicarboxylic acid component and the glycol component. Examples of the another comonomer include hydroxycarboxylic acids such as glycolic acid, p-hydroxybenzoic acid and p-β-hydroxyethoxybenzoic acid, monofunctional components such as alkoxycarboxylic acid, stearyl alcohol, benzyl alcohol, stearic acid, behenic acid, benzoic acid, t-butylbenzoic acid and benzoylbenzoic acid, and trifunctional or more components such as tricarballylic acid, trimellitic acid, trimesic acid, pyromellitic acid, naphthalenetetracarboxylic acid, gallic acid, trimethylolethane, trimethylolpropane, glycerol, pentaerythritol and sugar ester.

The first step is to obtain a polyester precursor by esterifying an aromatic dicarboxylic acid. The reaction is preferably carried out at a temperature higher than the boiling point of the glycol component. Therefore, the reaction temperature is preferably 150 to 250° C., more preferably 190 to 250° C., much more preferably 180 to 230° C. When the reaction temperature is lower than 150° C., the esterification reaction does not proceed fully and when the reaction temperature is higher than 250° C., a glycol such as diethylene glycol is produced as a by-product disadvantageously.

Although the reaction may be carried out under normal pressure, when it is carried out under increased pressure, the esterification reaction easily proceeds. Therefore, it is preferred to carry out the esterification reaction at a high temperature and a high pressure. The reaction pressure is preferably 10 to 200 kPa, more preferably 20 to 150 kPa in terms of absolute pressure.

The reaction time is preferably 10 minutes to 10 hours, more preferably 30 minutes to 7 hours. The reaction product which is a polyester precursor is obtained by this esterification reaction.

The point of time to terminate the esterification reaction is when the esterification rate becomes preferably not less than 85%, more preferably not less than 90%. When the esterification reaction is terminated at an esterification rate lower than 85%, to proceed to the subsequent polycondensation reaction, a polyester having a desired degree of polymerization and a desired terminal carboxy concentration may not be obtained.

The esterification rate (%) is a value calculated from the following equation. The esterification rate can be determined by nuclear magnetic resonance spectroscopy.

Esterification rate (%)=number of esterified carboxy groups/number of all carboxyl groups before esterification×100

The amount of the diol component is preferably 1.1 to 6 moles, more preferably 2 to 5 moles, much more preferably 3 to 5 moles based on 1 mole of the dicarboxylic acid component. Since the compound represented by the formula (a) has low solubility in ethylene glycol, it is preferred to adjust the amount of the glycol component in consideration of its solubility.

The catalyst may be a known esterification or ester interchange reaction catalyst. Examples of the catalyst include alkali metal compounds, alkali earth metal compounds and titanium compounds. Preferred examples of the catalyst include organic titanium compounds such as tetra-n-butyl titanate, tetraisopropyl titanate and hydrolysates thereof.

In the first step, a polyester precursor is obtained. An example of the polyester precursor is a compound represented by the following formula (a-1). In the formula, $R^A$ is as defined in the formula (a).

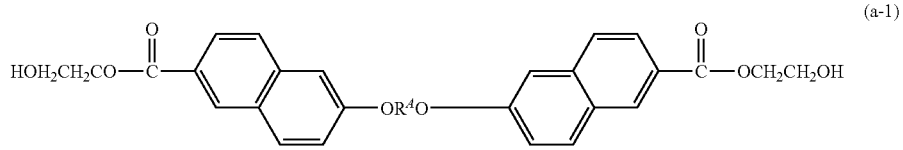

(a-1)

When the compound represented by the formula (b) is used as a dicarboxylic acid and ethylene glycol is used as a diol, a compound represented by the following formula (b-1) is contained in the polyester precursor. In the formula, $R^B$ is as defined in the formula (b).

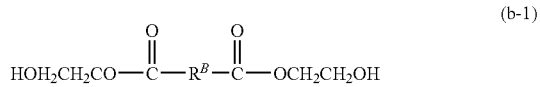

(b-1)

In the first step, a dicarboxylic acid component containing 6,6'-(alkylenedioxy)di-2-naphthoic acid represented by the formula (a) is reacted with a diol component to obtain a polyester precursor, thereby making it possible to obtain an aromatic polyester having a low content of a diethylene glycol component represented by the formula (E) as a reaction by-product and a low content of a terminal carboxyl group. An aromatic polyester having a low content of an alkali metal can also be obtained. As a result, an aromatic polyester having excellent heat resistance and color is obtained.

In the method in which an ester interchange reaction is carried out between an ester of 6,6'-(alkylenedioxy)di-2-naphthoic acid (ANA-ester) and an alkylene glycol as disclosed by the Patent Documents 1 to 4, a large amount of a dialkylene glycol component is apt to be produced as a by-product. Therefore, in order to suppress the deterioration of physical properties by the by-product and reduce the amount of ethylene glycol to the above range, an esterification reaction between ANA and a diol is preferably carried out. By reacting ANA with a diol directly and not through an ester compound thereof, the content of a reaction by-product such as diethylene glycol can be reduced.

According to an aspect of the present invention, in the first step, the compound represented by the formula (b-1) may be added to the polyester precursor obtained by esterifying mainly the compound represented by the formula (a).

[Second Step]

The second step is to polycondense the polyester precursor obtained in the first step in the presence of a polymerization catalyst.

The polycondensation catalyst is a metal compound containing at least one metal element. The polycondensation catalyst can also be used in the esterification reaction. Examples of the metal element include titanium, germanium, antimony, aluminum, nickel, zinc, tin, cobalt, rhodium, iridium, zirconium, hafnium, lithium, calcium and magnesium. Out of these, titanium, germanium, antimony, aluminum and tin are preferred, and a titanium compound is particularly preferred because it has high activity in both the esterification reaction and the polycondensation reaction.

Preferred examples of the titanium compound as the polycondensation catalyst include tetra-n-propyl titanate, tetraisopropyl titanate, tetra-n-butyl titanate, tetraisobutyl titanate, tetra-tert-butyl titanate, tetracyclohexyl titanate, tetraphenyl titanate, tetrabenzyl titanate, lithium oxalate titanate, potassium oxalate titanium, ammonium oxalate titanate, titanium oxide, orthoester or condensation orthoester of titanium, a reaction product comprising an orthoester or condensation orthoester of titanium and a hydroxycarboxylic acid, a reaction product comprising an orthoester or condensation orthoester of titanium, a hydroxycarboxylic acid and a phosphorus compound, and a reaction product comprising an orthoester or condensation orthoester of titanium, a polyhydric alcohol having at least two hydroxyl groups and 2-hydroxycarboxylic acid or a base.

Examples of the antimony compound include antimony trioxide, antimony pentoxide, antimony acetate and antimony glycoxide. Examples of the germanium compound include germanium dioxide, germanium tetraoxide, germanium hydroxide, germanium oxalate, germanium tetraethoxide and germanium tetra-n-butoxide.

Examples of the aluminum compound include carboxylates such as aluminum formate, aluminum acetate, basic aluminum acetate, aluminum propionate, aluminum oxalate, aluminum acrylate, aluminum laurate, aluminum stearate, aluminum benzoate, aluminum trichloroacetate, aluminum lactate, aluminum tartrate, aluminum citrate and aluminum salicylate, inorganic acid salts such as aluminum chloride, aluminum hydroxide, aluminum hydroxide chloride, aluminum carbonate, aluminum phosphate and aluminum phosphonate, aluminum alkoxides such as aluminum methoxide, aluminum ethoxide, aluminum-n-propoxide, aluminum isopropoxide, aluminum-n-butoxide and aluminum-tert-butoxide, aluminum chelate compounds such as aluminum acetylacetonate, aluminum acetylacetate, aluminum ethyl acetoacetate and aluminum ethyl acetoacetate diisopropoxide, organic aluminum compounds such as trimethyl aluminum and triethyl aluminum, partial hydrolysates thereof and aluminum oxide.

Out of these aluminum compounds, carboxylates, inorganic acid salts and chelate compounds are preferred, and basic aluminum acetate, aluminum lactate, aluminum chloride, aluminum hydroxide, aluminum hydroxide chloride and aluminum acetylacetonate are particularly preferred. Basic aluminum acetate stabilized by an additive such as boric acid may be used.

These catalysts may be used alone or in combination. The amount of the catalyst is preferably 0.001 to 0.5 mol %, more preferably 0.005 to 0.2 mol % based on the total number of moles of the recurring units of the polyester.

The polycondensation temperature ranges preferably from the melting point of the obtained polymer to 280° C., more preferably from a temperature 5° C. higher than the melting point to a temperature 30° C. higher than the melting point. The polycondensation reaction is preferably carried out under a reduced pressure of 30 Pa or less. When the pressure is higher than 30 Pa, the time required for the polycondensation reaction becomes long and it is difficult to obtain a polyester having a high degree of polymerization.

[Solid-State Polymerization]

An aromatic polyester having a high degree of polymerization can be obtained by further carrying out the solid-phase polymerization of the obtained polyester. The polyester containing a recurring unit represented by the formula (A) of the present invention has higher melt viscosity than polyethylene terephthalate, polyethylene naphthalate, polybutylene terephthalate and polytriethylene terephthalate. When the polymerization temperature is raised to reduce the melt viscosity, the thermal deterioration of the polymer chain is apt to occur. When the melt viscosity is high, the diffusion speed of a by-product produced by the reaction slows down, whereby it takes long to increase the degree of polymerization. Thus, there is a case where it is disadvantageous to further increase the degree of polymerization only by melt polymerization. Therefore, it is preferred to increase the degree of polymerization to a desired level by solid-phase polymerization.

The degree of polymerization can be increased to a desired level efficiently by forming a powder or chip of the prepolymer obtained by melt polymerization and solid-phase polymerizing it by heating at a temperature lower than its melting point. It is preferred to form a chip of the prepolymer in order to suppress the production of a powder as much as possible. The solid-phase polymerization is preferably carried out under reduced pressure and/or in an inert gas stream such as nitrogen, carbon dioxide or argon.

The intrinsic viscosity of the prepolymer is preferably 0.4 to 1.5 dl/g, more preferably 0.5 to 1.3 dl/g, much more preferably 0.6 to 1.0 dl/g. A prepolymer having an intrinsic viscosity of less than 0.4 dl/g is not preferred because a powder is produced by contact between chips thereof or an impact. The solid-phase polymerization must be carried out for a long time. When the intrinsic viscosity becomes higher than 1.5 dl/g, a special reactor is required for melt polymerization, whereby large stirring energy is required disadvantageously.

Prior to the solid-phase polycondensation, the prepolymer particle is preferably crystallized by heating it in a inert gas atmosphere, a steam gas atmosphere or vapor-containing inert gas atmosphere as required. After this crystallization, the prepolymer is further heated at a high temperature, thereby making it possible to carry out solid-phase polymerization at a higher temperature. The solid-phase polymerization is preferably carried out to ensure that the intrinsic viscosity of the obtained polyester becomes 0.7 to 3 dl/g. When the intrinsic viscosity is lower than 0.7, the significance of the solid-phase polymerization becomes weak. When the intrinsic viscosity is too high, the melt viscosity becomes too high, thereby reducing moldability. Therefore, the solid-phase polycondensation is preferably carried out to ensure that the intrinsic viscosity of the obtained polyester becomes 1.0 to 2.5 dl/g, particularly preferably 1.3 to 1.8 dl/g.

[Polyester (N)]

The polyester of the present invention is preferably the following polyester (N). The polyester (N) is excellent in stretchability and dimensional stability. The present invention is characterized in that a polyester having excellent dimensional stability and moldability is discovered by combining a unit represented by the formula (A) which has excellent dimensional stability and has a high melting point, high crystallinity and low fluidity and a non-liquid crystalline unit represented by the formula (B-2).

The polyester (N) is a polyester containing a dicarboxylic acid component and a diol component, wherein (i) the dicarboxylic acid component contains not less than 5 mol % and less than 50 mol % of a recurring unit represented by the following formula (A) and more than 50 mol % and not more than 95 mol % of a recurring unit represented by the following formula (B-2),

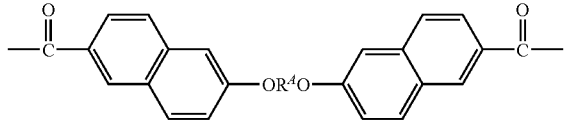

wherein $R^4$ is as described above,

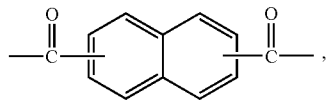

(ii) the diol component contains not less than 90 mol % of an ethylene glycol residue, and (iii) the polyester has an intrinsic viscosity measured at 35° C. by using a mixed solvent of p-chlorophenol and 1,1,2,2-tetrachloroethane (weight ratio of 40/60) of 0.4 to 3.

The content of the recurring unit represented by the formula (A) in the dicarboxylic acid component is preferably not more than 45 mol %, more preferably not more than 40 mol %, much more preferably not more than 35 mol %. The content of the recurring unit represented by the formula (B-2) in the dicarboxylic acid component is preferably not less than 55 mol %, more preferably not less than 60 mol %, much more preferably not less than 65 mol %.

The polyester (N) may contain another aromatic dicarboxylic acid residue, such as terephthalic acid residue, phthalic acid residue, isophthalic acid residue, 1,4-phenylenedioxydicarboxylic acid residue, 1,3-phenylenedioxydiacetic acid residue, 4,4'-diphenyldicarboxylic acid residue, 4,4'-diphenylether dicarboxylic acid residue, 4,4'-diphenyl ketone dicarboxylic acid residue, 4,4'-diphenoxyethanedicarboxylic acid residue, 4,4'-diphenylsulfonedicarboxylic acid residue or 2,7-naphthalenedicarboxylic acid residue as a dicarboxylic acid component in limits that do not impair the effect of the present invention.

The content of the ethylene glycol residue is preferably 90 to 100 mol %, more preferably 95 to 100 mol %. An isopropylene glycol residue, trimethylene glycol residue, tetramethylene glycol residue, hexamethylene glycol residue, octamethylene glycol residue or diethylene glycol residue may be contained as a glycol component except for ethylene glycol.

The polyester (N) has a melting point measured by DSC of preferably 195 to 260° C., more preferably 200 to 260° C. from the viewpoint of film forming properties. When the melting point exceeds the above upper limit and the polyester is molded by melt extrusion, fluidity deteriorates, whereby delivery is apt to become nonuniform. When the melting point falls below the above lower limit, the mechanical properties of polyethylene-2,6-naphthalene dicarboxylate are apt to be impaired though film forming properties are excellent.

In the XRD measurement of an amorphous material obtained by melting the polyester (N) at 340° C. and quenching it in an iced bath, preferably, a peak is not seen at a 2θ of 5 to 10°.

Zero or one heat absorption peak is preferably seen at 120 to 220° C. when the polyester (N) is cooled at a rate of 10°

C./min after it is heated up to 320° C. at a temperature elevation rate of 20° C./min in the DSC measurement. That is, it is preferred that no heat absorption peak should be seen or only one heat absorption peak should be seen.

The glass transition temperature (Tg) measured by DSC of the polyester (N) is preferably 105 to 120° C., more preferably 110 to 120° C. When Tg falls within this range, heat resistance and dimensional stability become satisfactory. Tg of a homopolymer of polyethylene-2,6-naphthalene dicarboxylate is about 118° C. When the unit represented by the formula (A) is introduced as a comonomer and even when it is copolymerized in an amount of less than 50 mol %, the polyester (N) has a Tg of 105° C. or higher.

Preferably, the polyester (N) contains less than 10 mol % of a dialkylene glycol component as a reaction by-product. When dialkylene glycol remains in the polymer or an ether component such as dialkylene glycol is contained in the skeleton of the polymer, the stiffness of the main chain is lost, thereby causing the deterioration of mechanical properties and heat resistance. It is known that this dialkylene glycol component is produced by a reaction between glycol components or a reaction between hydroxyl terminals at the terminals of the polymer. When the glycol component is ethylene glycol, diethylene glycol is produced. It is desired that the content of such a dialkylene glycol should be reduced to less than 10 mol %. It is preferably not more than 7 mol %. The content of the dialkylene glycol can be measured by a nuclear magnetic resonance apparatus.

The polyester (N) has a terminal carboxyl group concentration measured by NMR of preferably not more than 200 eq/ton, more preferably not more than 100 eq/ton. An increase in the carboxyl terminal concentration causes the growth of hydrolyzability due to an increase in water absorption coefficient and the acid catalysis of the carboxyl group. The polyester (N) having a low terminal carboxyl group concentration can be obtained by reacting 6,6'-(ethylenedioxy)di-2-naphthoic acid with a glycol directly and not through an ester compound thereof.

[Film]

The film of the present invention comprises the above-described polyester. The film of the present invention is obtained by melting the above polyester and extruding it into a sheet form. The above-described polyester is excellent in fluidity at the time of melting, crystallinity and film forming properties after that and becomes a film which is uniform in thickness. Further, the film of the present invention has the excellent mechanical properties of an aromatic polyester containing an aromatic dicarboxylic acid except for 6,6'-(alkylenedioxy)di-2-naphthoic acid.

In the present invention, the plane direction of the film refers to the direction of a plane orthogonal to the thickness of the film. The film forming direction (longitudinal direction) of the film is called "machine direction (MD)". The width direction (crosswise direction) of the film is called "transverse direction (TD)" orthogonal to the machine direction (MD) of the film.

(Temperature Expansion Coefficient: $\alpha t$)

The film of the present invention has a temperature expansion coefficient ($\alpha t$) in at least one direction in the plane direction of the film of preferably not more than $14 \times 10^{-6}/°$ C., more preferably not more than $10 \times 10^{-6}/°$ C., much more preferably not more than $7 \times 10^{-6}/°$ C., particularly preferably not more than $5 \times 10^{-6}/°$ C. When the temperature expansion coefficient ($\alpha t$) falls within this range and the film of the present invention is used in a magnetic recording tape, it can exhibit excellent dimensional stability to a dimensional change by ambient temperature and humidity variations.

The lower limit of the temperature expansion coefficient ($\alpha t$) in at least one direction in the plane direction of the film of the present invention is preferably $-15 \times 10^{-6}/°$ C., more preferably $-10 \times 10^{-6}/°$ C., much more preferably $-7 \times 10^{-6}/°$ C., particularly preferably $-5 \times 10^{-6}/°$ C.

The film of the present invention has a temperature expansion coefficient ($\alpha t$) in the transverse direction in the plane direction of the film of preferably not more than $14 \times 10^{-6}/°$ C., more preferably not more than $10 \times 10^{-6}/°$ C., much more preferably not more than $7 \times 10^{-6}/°$ C., particularly preferably not more than $5 \times 10^{-6}/°$ C. The lower limit of the temperature expansion coefficient ($\alpha t$) in the transverse direction in the plane direction of the film of the present invention is preferably $-15 \times 10^{-6}/°$ C., more preferably $-10 \times 10^{-6}/°$ C., much more preferably $-7 \times 10^{-6}/°$ C., particularly preferably $-5 \times 10^{-6}/°$ C.

A film having excellent dimensional stability to environmental variations is obtained by aligning the direction having a predetermined temperature expansion coefficient ($\alpha t$) with the direction in which dimensional stability is required of the film of the present invention.

According to the Patent Document 3, it is anticipated that the temperature expansion coefficient ($\alpha t$) of a polyester film obtained by copolymerizing polyalkylene-6,6'-(alkylenedioxy)di-2-naphthoate is high. However, according to the present invention, the temperature expansion coefficient ($\alpha t$) can be made low by using a polyester having a specific copolymerization ratio and stretching it.

(Humidity Expansion Coefficient: $\alpha h$)

The film of the present invention preferably has a humidity expansion coefficient ($\alpha h$) in at least one direction in the plane direction of the film of 1 to $7 \times 10^{-6}/\%$ RH.

The upper limit of the humidity expansion coefficient ($\alpha h$) in at least one direction in the plane direction is preferably $7 \times 10^{-6}/\%$ RH, more preferably $6 \times 10^{-6}/\%$ RH. When $\alpha h$ falls within this range, the dimensional stability of a magnetic recording tape obtained from the film of the present invention becomes excellent.

The one direction is preferably a direction in which the temperature expansion coefficient ($\alpha t$) is not more than $14 \times 10^{-6}/°$ C.

The lower limit is not particularly limited but is about $1 \times 10^{-6}/\%$ RH from the viewpoint of film forming properties. Particularly when the film of the present invention is used as a base film for a magnetic recording tape, it is preferred that the direction in which the above $\alpha h$ is obtained should be the transverse direction of a biaxially oriented polyester film because a deviation from the track can be suppressed completely when a magnetic recording tape is obtained from the film of the present invention.

(Young's Modulus: Y)

The film of the present invention has a Young's modulus (Y) in at least one direction in the plane direction of the film of preferably not less than 4.5 GPa, more preferably not less than 6 GPa. The upper limit of the Young's modulus (Y) in at least one direction in the plane direction of the film of the present invention is preferably about 12 GPa.

The Young's modulus in at least one direction in the plane direction of the film of the present invention is preferably 5 to 11 GPa, more preferably 6 to 10 GPa, much more preferably 7 to 10 GPa. Outside the above range, it may be difficult to achieve the above $\alpha t$ and $\alpha h$, or mechanical properties may become unsatisfactory. The Young's modulus can be adjusted by the above copolymerization ratio or stretching. The one direction is preferably a direction in which the temperature expansion coefficient ($\alpha t$) is not more than $14 \times 10^{-6}/°$ C.

The direction in which the temperature expansion coefficient ($\alpha t$) is not more than $14 \times 10^{-6}/°$ C. is at least one direction, preferably the transverse direction as described above but the direction orthogonal to the above direction is preferred if the requirements for temperature expansion coefficient ($\alpha t$), humidity expansion coefficient ($\alpha h$) and Young's modulus are satisfied from the viewpoint of dimensional stability.

That is, in the film of the present invention, the Young's moduli in two crossing directions in the plane direction of the film are both preferably not less than 5 GPa.

(Relationship Between Y and $\alpha h$)

In the film of the present invention, the Young's modulus (Y) and the humidity expansion coefficient ($\alpha h$) in at least one direction in the plane direction of the film satisfy the following expression (1).

$$\alpha h < -1.2Y + 17 \qquad (1)$$

(in the expression (1), the unit of $\alpha h$ is $10^{-6}/\%$ RH and the unit of Y is GPa)

The one direction is preferably a direction in which the temperature expansion coefficient ($\alpha t$) is not more than $14 \times 10^{-6}/°$ C. When the polyester film does not satisfy the relationship of the above expression (1), the polyester film has an $\alpha h$ corresponding to the Young's modulus of a conventional film made of polyethylene terephthalate or polyethylene-2,6-naphthalene dicarboxylate, and the effect of reducing humidity expansion by copolymerizing polyalkylene-6,6'-(alkylenedioxy)di-2-naphthoate is not fully obtained.

The coefficient "-1.2" in the above expression (1) is derived from the relationship between the Young's modulus and $\alpha h$ of the polyethylene-2,6-naphthalene dicarboxylate film of Comparative Examples 1 to 3 in this text. The aromatic polyester containing 6,6'-(alkylenedioxy)di-2-naphthoic acid is preferably polyethylene-2,6-naphthalene dicarboxylate because its Young's modulus is easily made high.

To reduce the humidity expansion coefficient ($\alpha h$) with respect to the Young's modulus, polyethylene terephthalate is preferably copolymerized. The relationship between the humidity expansion coefficient ($\alpha h$) and the Young's modulus (Y) is represented by preferably the following expression (1'), more preferably the following expression (1'').

$$\alpha h < -1.2Y + 16.5 \qquad (1')$$

$$\alpha h < -1.2Y + 16.0 \qquad (1'')$$

The lower limit of $\alpha h$ is not particularly limited but generally represented by the following expression (1''').

$$\alpha h > -1.2Y + 12.0 \qquad (1''')$$

The above Young's modulus, $\alpha t$ and $\alpha h$ can be adjusted by the copolymerization ratio and stretching which will be described hereinafter.

The film of the present invention is used as a base film for magnetic recording media. The film of the present invention is used in a high-density magnetic recording tape comprising a magnetic recording medium of a linear recording system. That is, the polyester film of the present invention can be used as a base film in a magnetic recording tape comprising the base film, a non-magnetic layer and a magnetic layer formed on one side of the base film and a back coat layer formed on the other side of the base film.

[Film Manufacturing Method]

The film of the present invention is stretched in the machine direction (MD) and the transverse direction (TD) to increase molecular orientation in these directions. The film of the present invention is preferably manufactured, for example, by the following method because $\alpha t$ and $\alpha h$ are easily reduced while film forming properties are retained. That is, the film of the present invention can be manufactured by melt extruding the polyester of the present invention, cooling and stretching it.

(Extrusion Step)

After the polyester of the present invention is first dried, this is the step of supplying the dried polyester into an extruder heated at the melting point (Tm: ° C.) of the polyester to (Tm+50)° C. to melt it and extruding it into a sheet form from a die such as a T die.

(Cooling Step)

This is the step of solidifying the extruded sheet-like product by quenching on a rotating cooling drum to obtain an unstretched film.

In order to achieve $\alpha t$, $\alpha h$ and Young's modulus specified in the present invention, it is important to facilitate stretching in the subsequent step. From this point of view, cooling with the cooling drum is preferably carried out very swiftly. From this point of view, cooling is preferably carried out not at a high temperature of 80° C. as disclosed in the Patent Document 3 but at a low temperature of 20 to 60° C. By cooling the film at such a low temperature, the crystallization of the unstretched film is suppressed, making it possible to carry out the subsequent stretching step smoothly.

(Stretching Step)

This is the step of biaxially stretching the obtained unstretched film. Biaxial stretching may be either sequential biaxial stretching or simultaneous biaxial stretching. A method of manufacturing the film of the present invention by stretching the unstretched film in the longitudinal direction and then in the transverse direction sequentially and heat setting it in this order will be described as an example. Preferably, the unstretched film is first stretched to 3 to 10 times, preferably 3 to 8 times in the longitudinal direction at the glass transition temperature (Tg: ° C.) of the aromatic polyester to (Tg+40)° C. and then to 3 to 8 times in the transverse direction at (Tg+10) to (Tg+50)° C. which is higher than the above stretching temperature and further heat set at a temperature lower than the melting point of the polymer, i.e., (Tg+50) to (Tg+150)° C. for 1 to 20 seconds and further 1 to 15 seconds.

Since the polyester film of the present invention contains the 6,6'-(alkylenedioxy)di-2-naphthoic acid component, it has very high stretchability but its Young's modulus tends to lower at the same draw ratio. Therefore, to obtain a target Young's modulus, the film must be stretched at a higher draw ratio. Although film forming stability is generally impaired when the draw ratio is increased, as the 6,6'-(alkylenedioxy)di-2-naphthoic acid component is copolymerized in the present invention, stretchability is very high and the film of the present invention has no such a problem.

The polyester film of the present invention may be manufactured by stretching the unstretched film in the longitudinal direction and the transverse direction at the same time. As for the conditions for this simultaneous biaxial stretching, refer to the above draw ratio and the stretching temperature.

When the polyester film of the present invention is a laminated film, two or more molten polyesters are laminated together in a die and then extruded into a film form. Alternatively, after the two or more molten polyesters are extruded from a die, they are laminated together and solidified by quenching to obtain a laminated unstretched film. The extrusion temperature is preferably the melting point (Tm: ° C.) of each polyester to (Tm+70)° C.

Biaxial stretching and heat setting may be carried out in the same manner as the above single-layer film. When a coating layer is formed, preferably, a desired coating fluid is applied to one side or both sides of the unstretched film or the monoaxially stretched film, and then biaxial stretching and heat setting are carried out in the same manner as the above-described single-layer film.

A magnetic recording tape can be manufactured by forming a non-magnetic layer and a magnetic layer on one side of the base film which is the polyester film of the present invention in this order and a back coat layer on the other side.

[Composition]

The present invention includes a composition comprising a polyester which contains a predetermined amount of the acid component represented by the above formula (A) and particles having an average particle diameter of 0.05 to 5 μm.

The composition of the present invention provides a film which has extremely low stress at the time of stretching and small voids even when it is stretched at a high draw ratio. Further, the humidity expansion coefficient ($\alpha h$) of the obtained film can be made small without increasing the temperature expansion coefficient ($\alpha t$). In the composition of the present invention, the polyester is as described above.

The average particle diameter of the particles is not less than 0.05 μm, preferably not less than 0.07 μm, more preferably not less than 0.1 μm, much more preferably not less than 0.15 μm. When the average particle diameter falls below the lower limit, the particles are very small, the influence of voids is hardly seen, and the effect of improving the running and winding properties of the film is hardly obtained fully. The average particle diameter is not more than 5 μm, preferably not more than 3 μm. When the film is used as a magnetic recording medium, the upper limit of the average particle diameter is preferably 1 μm. When the average particle diameter of the particles falls within this range, the handling properties of the obtained molded article can be improved.

Therefore, the average particle diameter of the particles is preferably 0.05 to 5 μm, more preferably 0.07 to 5 μm, much more preferably 0.1 to 3 μm. The average particle diameter is the average value of the area circle equivalent diameters (d) of 1,000 particles observed through a scanning electron microscope.

The composition of the present invention contains the above particles in an amount of preferably not less than 0.01 wt %, more preferably not less than 0.05 wt %, much more preferably not less than 0.1 wt % based on the weight of the resin composition. When the content of the particles falls below the lower limit, the number of the particles becomes small, the influence of voids is hardly seen, and the effect of improving the running and winding properties of the film is hardly obtained fully. The upper limit of the content is not more than 50 wt %, preferably not more than 10 wt %. Particularly when the film is used as a film for magnetic recording media, it is more preferably not more than 1 wt %. When the content of the particles falls within this range, the handling properties of the obtained molded article can be improved. Therefore, the content of the particles is preferably 0.01 to 50 wt %, more preferably 0.05 to 10 wt % based on the weight of the composition.

The volume shape factor (f) of the particles is preferably 0.4 to $\pi/6$, more preferably 0.5 to $\pi/6$. When the volume shape factor (f) is larger than the lower limit and even when the condition for the arrangement of the particles is different, the formed projections are apt to be uniform in shape. When the obtained projections become uniform and a film having the same friction coefficient is produced, the film has lower surface roughness, and flatness and layer constitution can be well balanced. As the volume shape factor (f) increases, the shapes of the particles become more globular and the interface between the polymer and the particles becomes smaller. Although voids are generally formed easily, as the polymer having small stretching stress is used in the present invention as described above, even when almost globular particles are used, projections can be made uniform while the formation of voids is suppressed.

When the composition of the present invention contains particles having the above specific volume shape factor (f), a film obtained from the composition is excellent in transfer properties and surface flatness.

The volume shape factor (f) is obtained by the following method. That is, 1,000 particles are observed through a scanning electron microscope to obtain their projection plane maximum diameters (D) and their area circle equivalent diameters (d). The volumes (V) are calculated from the area circle equivalent diameters (d) of the particles based on the condition that the shapes of the particles are globular, the volume shape factors of the particles are calculated from the following equation, and the average value of these is taken as volume shape factor (f).

$$f = V/D^3$$

The volume shape factor (f) indicates the shape of each particle, and the shape of a particle having a volume shape factor of $\pi/6$ is globular (spherical). That is, a particle having a volume shape factor (f) of 0.4 to $\pi/6$ is substantially globular or spherical, including an elliptic ball like a rugby ball.

Examples of the particles include organic polymer particles, metal oxides, metal carbonates, metal sulfates, carbons and clay minerals.

The organic polymer particles include silicone resin, crosslinked polystyrene, crosslinked acrylic resin, melamine-formaldehyde resin, aromatic polyamide resin, polyimide resin, polyamide-imide resin and crosslinked polyesters. The metal oxides include aluminum oxide, titanium dioxide, silicon dioxide (silica), magnesium oxide, zinc oxide and zirconium oxide. The metal carbonates include magnesium carbonate and calcium carbonate. The metal sulfates include calcium sulfate and barium sulfate. The carbons include carbon black, graphite and diamond. The clay minerals include kaolin, clay and bentonite.

Externally added particles which are added in a particulate state such as core-shell type composite particles comprising a core and a shell made of different materials and internally precipitated particles formed by the precipitation of a catalyst are also included.

Out of these, at least one type of particles selected from the group consisting of organic polymer particles such as silicone resin, crosslinked acrylic resin, crosslinked polyester and crosslinked polystyrene and silica are preferred from the viewpoint of the above volume shape factor (f). At least one type of particles selected from the group consisting of silicone resin, crosslinked polystyrene and silica are particularly preferred. As a matter of course, they may be used in combination of two or more.

It is preferred that the particles should be of at least one type selected from the group consisting of silica particles and organic polymer particles. It is also preferred that the particles should be of at least one type selected from the group consisting of silicone resin particles and crosslinked polystyrene particles.

As a matter of course, the composition of the present invention may contain the above particles, and the particles may be composed of one component, or two or more components.

The particles are preferably monodisperse particles. When the contained particles are agglomerated particles or porous particles, the particles contained in the polymer are apt to vary in diameter though the voids are easily controlled. That is, as the composition of the present invention has the excellent effect of controlling voids, monodisperse particles can be advantageously used to obtain both the transfer properties and surface flatness of the film like the above volume shape factor (f) without regard to a void problem. The term "monodisperse particles" as used herein means that most primary particles, preferably not less than 60% of all primary particles are dispersed in the polymer as they are.

The method of adding the particles to the polyester is not particularly limited, and an addition method known per se may be employed. For example, the particles are added in the form of a glycol slurry in the stage of a polymerization reaction, or the particles are melt kneaded with the obtained polyester by a kneading extruder. From the viewpoint of the dispersibility of the particles, it is preferred that the particles should be added in the form of a glycol slurry in the stage of a polymerization reaction to prepare a particle master polymer of a polyester composition containing the particles in a high concentration and that the particle master polymer should be diluted with a polyester containing no particles.

The composition of the present invention may be mixed with another thermoplastic polymer, stabilizer such as an ultraviolet absorbent, antioxidant, plasticizer, lubricant, flame retardant, release agent, pigment, nucleating agent, filler or glass fiber, carbon fiber or lamellar silicate as required in limits that do not impair the effect of the present invention. Examples of the another thermoplastic polymer include aliphatic polyester-based resins, polyamide-based resins, polycarbonates, ABS resin, polymethyl methacrylate, polyamide-based elastomers, polyester-based elastomers, polyether imide and polyimide.

EXAMPLES

The following examples and comparative examples are provided to further illustrate the present invention. In the present invention, the characteristic properties of these examples were measured and evaluated by the following methods.

(1) Intrinsic Viscosity

The intrinsic viscosity of the obtained polyester was measured at 35° C. by dissolving the polymer in a mixed solvent of p-chlorophenol and tetrachloroethane (weight ratio of 40/60).

(2) Glass Transition Point and Melting Point

The glass transition point and the melting point were measured by DSC (Thermal Analyst 2100 of TA Instruments) at a temperature elevation rate of 20° C./min.

(3) Copolymerization Ratio (Glycol Component)

10 mg of a sample was dissolved in 0.5 ml of a mixed solution of p-chlorophenol and heavy tetrachloroethane (volume ratio of 3:1) at 80° C., isopropylamine was added to and fully mixed with the resulting solution, and the amount of the glycol component was measured at 80° C. by 600M $^1$H-NMR (JEOL A600 of Hitachi Electronics Services Co., Ltd.).

(Acid Component)

50 mg of the sample was dissolved in 0.5 ml of a mixed solution of p-chlorophenol and heavy tetrachloroethane (volume ratio of 3:1) at 140° C., and the amount of the acid component was measured at 150° C. by 400M $^{13}$C-NMR (JEOL A600 of Hitachi Electronics Services Co., Ltd.).

(4) Young's Modulus

The obtained film was cut to a width of 10 mm and a length of 15 cm to obtain a sample and the sample was pulled by a universal tensile tester (Tensilon of Toyo Baldwin Co., Ltd.) at a chuck interval of 100 mm, a pulling rate of 10 mm/min and a chart rate of 500 mm/min. The Young's modulus was calculated from the tangent of a rising portion in the obtained load-elongation curve.

(5) Temperature Expansion Coefficient ($\alpha t$)

The obtained film was cut to a length of 15 mm and a width of 5 mm to ensure that the width direction of the film became the measurement direction, and the obtained sample was set in the TMA3000 of ULVAC, Inc., pre-treated in a nitrogen atmosphere (0% RH) at 60° C. for 30 minutes and then cooled to room temperature. Thereafter, the sample was heated from 25° C. to 70° C. at a temperature elevation rate of 2° C./min to measure the length of the sample at each temperature in order to calculate its temperature expansion coefficient ($\alpha t$) from the following equation. The measurement direction was the longitudinal direction of the sample, and the measurement was made 5 times to obtain the average value of the measurement data.

$$\alpha t = \{(L^{60} - L^{40})\}/(L^{40} \times \Delta T)\} + 0.5$$

In the above equation, $L^{40}$ is the length (mm) of the sample at 40° C., $L^{60}$ is the length (mm) of the sample at 60° C., $\Delta T$ is 20 (=60−40)° C., and 0.5 is the temperature expansion coefficient ($\alpha t$) ($\times 10^{-6}/°$ C.) of quartz glass.

(6) Humidity Expansion Coefficient ($\alpha h$)

The obtained film was cut to a length of 15 mm and a width of 5 mm to ensure that the width direction of the film became the measurement direction, and the obtained sample was set in the TMA3000 of ULVAC, Inc. to measure the length of the sample at a humidity of 30% RH and 70% RH in a 30° C. nitrogen atmosphere so as to calculate its humidity expansion coefficient ($\alpha h$) from the following equation. The measurement direction was the longitudinal direction of the sample, and the measurement was made 5 times to obtain the average value of the measurement data as $\alpha h$.

$$\alpha h = (L^{70} - L^{30})/(L^{30} \times \Delta H)$$

In the above equation, $L^{30}$ is the length (mm) of the sample at 30% RH, $L^{70}$ is the length (mm) of the sample at 70% RH, and $\Delta H$ is 40 (=70−30) % RH.

(7) Average Particle Diameter (μm), Monodisperse Index, Volume Shape Factor (f) of Particles The polyester composition was injected into an extruder and extruded from a die in a molten state at 300° C. to obtain an unstretched sheet having a thickness of 1 mm. This sample was fixed on the sample table of a scanning electron microscope to carry out ion etching on the surface of the sample by using the sputtering device (JFC-1100 ion etching device) of JEOL Ltd. under the following conditions. As for the conditions, the sample was set in a bell jar, the vacuum degree was raised to about $10^{-3}$ Torr (0.133 Pa), and ion etching was carried out at a voltage of 0.25 kV and a current of 12.5 mA for about 10 minutes. Further, gold sputtering was made on the surface of the sample with the above apparatus, and the sample was observed through the scanning electron microscope at a magnification of 5,000 to 10,000× to obtain the projection plane maximum diameters (D) (μm) and the area circle equivalent diameters (d) of 1,000 particles with the Luzex 500 of NIRECO CORPORATION. The average value of the area circle equivalent diameters (d) of the 1,000 particles was taken as average particle diameter. The volumes (V) (μm$^3$) were calculated from the area circle equivalent diameters (d) of the particles under the condition that the particles are globular, the volume shape factors of the particles were calculated from the following equation, and the average value of these was taken as volume shape factor (f).

$$f = V/D^3$$

When the number of primary particles dispersed as they were was 600 or more out of the above 1,000 particles, it was judged that the particles were monodisperse particles. The average particle diameter of the particles before they were added to the polyester composition was measured in the same manner as above without carrying out ion etching.

(8) Content of Particles

A solvent which dissolves the polyester but not the particles was selected to dissolve the polyester composition, and the particles were separated from the polyester by centrifugation to obtain the ratio (wt) of the total weight of the particles to the weight of the whole polyester composition as the content of the particles.

(9) Measurement of Void Ratio

A sample film piece was fixed on the sample table of a scanning electron microscope, and ion etching was carried out on the surface of the film by using the sputtering device (JFC-1100 ion etching device) of JEOL Ltd. under the following conditions. As for the conditions, the sample was set in a bell jar, the vacuum degree was raised to about $10^{-3}$ Torr (0.133 Pa), and ion etching was carried out at a voltage of 0.25 kV and a current of 12.5 mA for about 10 minutes. Further, gold sputtering was made on the surface of the sample with the above apparatus, the sample was observed through the scanning electron microscope at a magnification of 20,000×, and the obtained image was analyzed by the Luzex 500 of NIRECO CORPORATION to extract particles whose boundaries could be confirmed by voids around the particles and obtain the particle area and the void area for each particle so as to calculate the void ratio based on the following definition.

Void ratio=(particle area+void area)/particle area

This measurement was made on 100 particles and the average value of the measurement data was taken as void ratio. As the void ratio becomes smaller, it is considered that the voids are smaller.

(10) Esterification Rate

The esterification rate was measured by 600 MHz $^1$H-NMR (JEOL A-600 of JEOL Ltd.).

TA in the table represents a terephthalic acid component, NA a 2,6-naphthalenedicarboxylic acid component, ENA a 6,6'-(ethylenedioxy)di-2-naphthoic acid component, EG an ethylene glycol component, and DEG a diethylene glycol component.

Example 1

Polyester, TA (65)/ENA (35)

An esterification reaction and an ester interchange reaction were carried out among dimethyl terephthalate, 6,6'-(ethylenedioxy)di-2-naphthoic acid and ethylene glycol in the presence of titanium tetrabutoxide, and then a polycondensation reaction was carried out to obtain a polyester. The obtained polyester had an intrinsic viscosity of 0.73 dl/g and contained a terephthalic acid component in an amount of 65 mol % and a 6,6'-(ethylenedioxy)di-2-naphthoic acid component in an amount of 35 mol % of the total of all the acid components and an ethylene glycol component in an amount of 98.5 mol % and a diethylene glycol component in an amount of 1.5 mol % of the total of all the glycol components.

Silica particles having an average particle diameter of 0.5 μm were contained in the polyester in an amount of 0.2 wt % based on the weight of the obtained resin composition before the polycondensation reaction. This polyester had a melting point of 233° C. and a glass transition temperature of 91° C.

(Film Formation)

The polyester obtained as described above was supplied into an extruder to be extruded into a sheet form on a rotating cooling drum having a temperature of 40° C. in a molten state from a die at 290° C. to obtain an unstretched film. This unstretched film was then stretched to 4.0 times in the machine direction (MD) by heating with an IR heater from above to ensure that the film surface temperature became 110° C. between two rollers having different revolving speeds installed in the machine direction (MD) so as to obtain a monoaxially oriented film. This monoaxially oriented film was guided to a stenter to be stretched to 4.5 times in the transverse direction (TD) at 120° C. and then heat set at 210° C. for 3 seconds to obtain a biaxially oriented film having a thickness of 10 μm. The characteristic properties of the obtained biaxially oriented polyester film are shown in Table 1.

Example 2

Polyester, TA(80)/ENA(20)

An esterification reaction and an ester interchange reaction were carried out among dimethyl terephthalate, 6,6'-(ethylenedioxy)di-2-naphthoic acid and ethylene glycol in the presence of titanium tetrabutoxide, and then a polycondensation reaction was carried out to obtain a polyester. The obtained polyester had an intrinsic viscosity of 0.68 dl/g and contained a terephthalic acid component in an amount of 80 mol % and a 6,6'-(ethylenedioxy)di-2-naphthoic acid component in an amount of 20 mol % of the total of all the acid components and an ethylene glycol component in an amount of 98 mol % and a diethylene glycol component in an amount of 2 mol % of the total of all the glycol components.

Silica particles having an average particle diameter of 0.5 μm were contained in the polyester in an amount of 0.2 wt % based on the weight of the obtained resin composition before the polycondensation reaction. This aromatic polyester had a melting point of 230° C. and a glass transition temperature of 85° C.

(Film Formation)

The obtained polyester was supplied into an extruder to be extruded into a sheet form on a rotating cooling drum having a temperature of 30° C. in a molten state from a die at 290° C. to obtain an unstretched film. This unstretched film was then stretched to 5.0 times in the machine direction (MD) by heating with an IR heater from above to ensure that the film surface temperature became 105° C. between two rollers having different revolving speeds installed in the machine direction (MD) to obtain a monoaxially oriented film. This monoaxially oriented film was guided to a stenter to be stretched to 5.0 times in the transverse direction (TD) at 115° C. and then heat set at 210° C. for 3 seconds to obtain a biaxially oriented film having a thickness of 10 μm. The characteristic properties of the obtained biaxially oriented polyester film are shown in Table 1.

Example 3

Polyester, NA(73)/ENA(27)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.78 dl/g and contained a 2,6-naphthalenedicarboxylic acid component in an amount of 73 mol % and a 6,6'-(ethylenedioxy) di-2-naphthoic acid component in an amount of 27 mol % of the total of all the acid components and an ethylene glycol component in an amount of 98.5 mol % and a diethylene glycol component in an amount of 1.5 mol % of the total of all the glycol components.

Silica particles having an average particle diameter of 0.5 μm were contained in the polyester in an amount of 0.2 wt % based on the weight of the obtained resin composition before the polycondensation reaction. This polyester had a melting point of 240° C. and a glass transition temperature of 112° C.

(Film Formation)

The obtained polyester was supplied into an extruder to be extruded into a sheet form on a rotating cooling drum having a temperature of 45° C. in a molten state from a die at 300° C. to obtain an unstretched film. This unstretched film was then stretched to 4.0 times in the machine direction (MD) by heating with an IR heater from above to ensure that the film surface temperature became 130° C. between two rollers having different revolving speeds installed in the machine direction (MD) to obtain a monoaxially oriented film. This monoaxially oriented film was guided to a stenter to be stretched to 6.0 times in the transverse direction (TD) at 140° C. and then heat set at 200° C. for 10 seconds to obtain a biaxially oriented film having a thickness of 7 μm. The characteristic properties of the obtained biaxially oriented polyester film are shown in Table 1.

Example 4

Polyester NA (94)/ENA (6)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester. The obtained polyester had an intrinsic viscosity of 0.81 dl/g and contained a 2,6-naphthalenedicarboxylic acid component in an amount of 94 mol % and a 6,6'-(ethylenedioxy) di-2-naphthoic acid component in an amount of 6 mol % of the total of all the acid components and an ethylene glycol component in an amount of 99 mol % and a diethylene glycol component in an amount of 1 mol % of the total of all the glycol components.

Silica particles having an average particle diameter of 0.5 μm were contained in the polyester in an amount of 0.2 wt % based on the weight of the obtained resin composition before the polycondensation reaction. This polyester had a melting point of 255° C. and a glass transition temperature of 117° C.

(Film Formation)

The obtained polyester was supplied into an extruder to be extruded into a sheet form on a rotating cooling drum having a temperature of 55° C. in a molten state from a die at 300° C. to obtain an unstretched film. This unstretched film was then stretched to 3.0 times in the machine direction (MD) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 5.0 times in the transverse direction (TD) at 135° C. and then heat set at 200° C. for 10 seconds to obtain a biaxially oriented film having a thickness of 10 μm. The characteristic properties of the obtained biaxially oriented polyester film are shown in Table 1.

Example 5

The procedure of Example 4 was repeated except that the temperature for stretching in the machine direction was changed to 140° C., the draw ratio in the machine direction was changed to 5.0 times, the temperature for stretching in the transverse direction was changed to 140° C., the draw ratio in the transverse direction was changed to 4.2 times and the heat setting temperature was changed to 210° C. to obtain a biaxially oriented film having a thickness of 10 μm.

The characteristic properties of the obtained biaxially oriented polyester film are shown in Table 1. The obtained film had an extremely low Young's modulus in the transverse direction, and a magnetic recording medium comprising the film had a large dimensional change in the transverse direction and was very stretchy when tension was applied in the transverse direction.

Example 6

Polyester, NA(57)/ENA(43)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.78 dl/g and contained a 2,6-naphthalenedicarboxylic acid component in an amount of 57 mol % and a 6,6'-(ethylenedioxy) di-2-naphthoic acid component in an amount of 43 mol % of the total of all the acid components and an ethylene glycol component in an amount of 98.5 mol % and a diethylene glycol component in an amount of 1.5 mol % of the total of all the glycol components.

Silica particles having an average particle diameter of 0.5 μm were contained in the polyester in an amount of 0.2 wt % based on the weight of the obtained resin composition before the polycondensation reaction. This polyester had a melting point of 253° C. and a glass transition temperature of 116° C.

(Film Formation)

The obtained polyester was supplied into an extruder to be extruded into a sheet form on a rotating cooling drum having a temperature of 45° C. in a molten state from a die at 300° C. to obtain an unstretched film. This unstretched film was then stretched to 4.5 times in the machine direction (MD) by heating with an IR heater from above to ensure that the film surface temperature became 140° C. between two rollers having different revolving speeds installed in the machine direction (MD) to obtain a monoaxially oriented film. This monoaxially oriented film was guided to a stenter to be stretched to 5.2 times in the transverse direction (TD) at 140° C. and then heat set at 200° C. for 5 seconds to obtain a biaxially oriented film having a thickness of 10 μm. The characteristic properties of the obtained biaxially oriented polyester film are shown in Table 1.

Comparative Example 1

Polyester, NA(100)

An esterification reaction and an ester interchange reaction were carried out between dimethyl 2,6-naphthalene dicarboxylate and ethylene glycol in the presence of titanium tetrabutoxide, and then a polycondensation reaction was carried out to obtain a polyester. The obtained polyester had an intrinsic viscosity of 0.62 dl/g and contained a diethylene glycol component in an amount of 1.5 mol % of the total of all the glycol components.

Silica particles having an average particle diameter of 0.5 μm were contained in the polyester in an amount of 0.2 wt % based on the weight of the obtained resin composition before the polycondensation reaction. This polyester had a melting point of 270° C. and a glass transition temperature of 120° C.
(Film Formation)

The obtained polyester was supplied into an extruder to be extruded into a sheet form on a rotating cooling drum having a temperature of 60° C. in a molten state from a die at 300° C. to obtain an unstretched film. This unstretched film was then stretched to 3.0 times in the machine direction (MD) by heating with an IR heater from above to ensure that the film surface temperature became 140° C. between two rollers having different revolving speeds installed in the machine direction to obtain a monoaxially oriented film. This monoaxially oriented film was guided to a stenter to be stretched to 4.3 times in the transverse direction (TD) at 140° C. and then heat set at 200° C. for 10 seconds to obtain a biaxially oriented film having a thickness of 10 μm. The characteristic properties of the obtained biaxially oriented polyester film are shown in Table 1.

Comparative Example 2

The procedure of Comparative Example 1 was repeated except that the temperature for stretching in the machine direction was changed to 140° C., the draw ratio in the machine direction was changed to 4.0 times, the temperature for stretching in the transverse direction was changed to 140° C., the draw ratio in the transverse direction was changed to 4.0 times and the heat setting temperature was changed to 200° C. to obtain a biaxially oriented film. The characteristic properties of the obtained biaxially oriented polyester film are shown in Table 1.

Comparative Example 3

The procedure of Comparative Example 1 was repeated except that the temperature for stretching in the machine direction was changed to 140° C., the draw ratio in the machine direction was changed to 4.5 times, the temperature for stretching in the transverse direction was changed to 140° C., the draw ratio in the transverse direction was changed to 3.4 times and the heat setting temperature was changed to 200° C. to obtain a biaxially oriented film. The characteristic properties of the obtained biaxially oriented polyester film are shown in Table 1.

TABLE 1

| | Polymer | | | | | Young's modulus (Y) | | Humidity expansion coefficient ($\alpha h$) | | Temperature expansion coefficient ($\alpha t$) | |
|---|---|---|---|---|---|---|---|---|---|---|---|
| | Acid component Type (mol %) | Glycol component Type (mol %) | Intrinsic viscosity dl/g | Melting point ° C. | Tg ° C. | MD GPa | TD GPa | MD $\times 10^{-6}$/ % RH | TD $\times 10^{-6}$/ % RH | MD $\times 10^{-6}$/ ° C. | TD $\times 10^{-6}$/ ° C. |
| Ex. 1 | TA(65)/ENA(35) | EG(98.5)/DEG(1.5) | 0.73 | 233 | 91 | 2.7 | 8.0 | 6.4 | 3.5 | 62.8 | 2.9 |
| Ex. 2 | TA(80)/ENA(20) | EG(98)/DEG(2) | 0.68 | 230 | 85 | 4.9 | 4.8 | 7.9 | 8.0 | 10.6 | 13.8 |
| Ex. 3 | NA(73)/ENA(27) | EG(98.5)/DEG(1.5) | 0.78 | 240 | 112 | 3.9 | 8.3 | 6.3 | 4.3 | 16.4 | -3.5 |
| Ex. 4 | NA(94)/ENA(6) | EG(99)/DEG(1) | 0.81 | 255 | 117 | 5.7 | 7.5 | 9.4 | 6.4 | 9.6 | -4.2 |
| Ex. 5 | NA(94)/ENA(6) | EG(99)/DEG(1) | 0.81 | 255 | 117 | 8.3 | 5.0 | 5.0 | 10.7 | -2.5 | 14.6 |
| Ex. 6 | NA(57)/ENA(43) | EG(98.5)/DEG(1.5) | 0.78 | 253 | 116 | 5.0 | 6.0 | 5.1 | 4.8 | 12.3 | 8.7 |
| C. Ex. 1 | NA(100) | EG(98.5)/DEG(1.5) | 0.62 | 270 | 120 | 5.5 | 9.5 | 13.5 | 8.6 | 14.6 | -3.8 |
| C. Ex. 2 | NA(100) | EG(98.5)/DEG(1.5) | 0.62 | 270 | 120 | 7.1 | 7.3 | 11.5 | 10.5 | 7.1 | 4.5 |
| C. Ex. 3 | NA(100) | EG(98.5)/DEG(1.5) | 0.62 | 270 | 120 | 9.2 | 5.7 | 9.2 | 13.5 | -2.0 | 13.5 |

Ex.: Example
C. Ex.: Comparative Example

Example 7

Polyester, NA(73)/ENA(27)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.66 dl/g and contained a 2,6-naphthalenedicarboxylic acid component in an amount of 73 mol % and a 6,6'-(ethylenedioxy)di-2-naphthoic acid component in an amount of 27 mol % of the total of all the acid components and an ethylene glycol component in an amount of 98 mol % and a diethylene glycol component in an amount of 2 mol % of the total of all the glycol components.

Silica particles having an average particle diameter of 0.5 µm were contained in the polyester in an amount of 0.2 wt % based on the weight of the obtained resin composition before the polycondensation reaction. This polyester had a melting point of 240° C. and a glass transition temperature of 117° C.
(Film Formation)

The obtained polyester was supplied into an extruder to be extruded into a sheet form on a rotating cooling drum having a temperature of 50° C. in a molten state from a die at 290° C. to obtain an unstretched film. This unstretched film was then stretched to 6.2 times in the machine direction (MD) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 6.3 times in the transverse direction (TD) at 140° C. and then heat set at 200° C. for 10 seconds to obtain a biaxially oriented film having a thickness of 6 µm. The characteristic properties of the obtained biaxially oriented polyester film are shown in Table 2.

Example 8

The procedure of Example 7 was repeated except that the temperature for stretching in the machine direction was changed to 135° C., the draw ratio in the machine direction was changed to 5.3 times, the temperature for stretching in the transverse direction was changed to 135° C., the draw ratio in the transverse direction was changed to 5.8 times and the heat setting temperature was changed to 210° C. to obtain a biaxially oriented film. The characteristic properties of the obtained biaxially oriented polyester film are shown in Table 2.

Example 9

Polyester, NA(94)/ENA(6)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester. The obtained polyester had an intrinsic viscosity of 0.72 dl/g and contained a 2,6-naphthalenedicarboxylic acid component in an amount of 94 mol % and a 6,6'-(ethylenedioxy)di-2-naphthoic acid component in an amount of 6 mol % of the total of all the acid components and an ethylene glycol component in an amount of 99 mol % and a diethylene glycol component in an amount of 1 mol % of the total of all the glycol components.

Silica particles having an average particle diameter of 0.4 µm were contained in the polyester in an amount of 0.2 wt % based on the weight of the obtained resin composition before the polycondensation reaction. This polyester had a melting point of 255° C. and a glass transition temperature of 119° C.
(Film Formation)

The obtained polyester was supplied into an extruder to be extruded into a sheet form on a rotating cooling drum having a temperature of 60° C. in a molten state from a die at 290° C. to obtain an unstretched film. This unstretched film was then stretched to 5.3 times in the machine direction (MD) by heating with an IR heater from above to ensure that the film surface temperature became 140° C. between two rollers having different revolving speeds installed in the machine direction to obtain a monoaxially oriented film. This monoaxially oriented film was guided to a stenter to be stretched to 4.0 times in the transverse direction (TD) at 140° C. and then heat set at 200° C. for 10 seconds to obtain a biaxially oriented film having a thickness of 8 µm. The characteristic properties of the obtained biaxially oriented polyester film are shown in Table 2.

Example 10

The procedure of Example 9 was repeated except that the temperature for stretching in the machine direction was changed to 135° C., the draw ratio in the machine direction was changed to 3.0 times, the temperature for stretching in the transverse direction was changed to 135° C., the draw ratio in the transverse direction was changed to 5.0 times and the heat setting temperature was changed to 210° C. to obtain a biaxially oriented film. The characteristic properties of the obtained biaxially oriented polyester film are shown in Table 2.

Example 11

Polyester, NA(80)/ENA(20)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.77 dl/g and contained a 2,6-naphthalenedicarboxylic acid component in an amount of 80 mol % and a 6,6'-(ethylenedioxy)di-2-naphthoic acid component in an amount of 20 mol % of the total of all the acid components and an ethylene glycol component in an amount of 99 mol and a diethylene glycol component in an amount of 1 mol % of the total of all the glycol components.

Silica particles having an average particle diameter of 0.4 µm were contained in the polyester in an amount of 0.1 wt % based on the weight of the obtained resin composition before the polycondensation reaction. This polyester had a melting point of 252° C. and a glass transition temperature of 116° C.
(Film Formation)

The obtained polyester was supplied into an extruder to be extruded into a sheet form on a rotating cooling drum having a temperature of 50° C. in a molten state from a die at 290° C. to obtain an unstretched film. This unstretched film was then stretched to 5.5 times in the machine direction (MD) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 4.3 times in the transverse direction (TD) at 140° C. and then heat set at 210° C. for 10 seconds to obtain a biaxially oriented film having a thickness of 6 µm. The characteristic properties of the obtained biaxially oriented polyester film are shown in Table 2.

Example 12

Polyester, NA(65)/ENA(35)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.77 dl/g and contained a 2,6-naphthalenedicarboxylic acid component in an amount of 65 mol % and a 6,6'-(ethylenedioxy) di-2-naphthoic acid component in an amount of 35 mol % of the total of all the acid components and an ethylene glycol component in an amount of 98 mol % and a diethylene glycol component in an amount of 2 mol % of the total of all the glycol components.

Silica particles having an average particle diameter of 0.4 μm were contained in the polyester in an amount of 0.1 wt % based on the weight of the obtained resin composition before the polycondensation reaction. This polyester had a melting point of 247° C. and a glass transition temperature of 116° C.

(Film Formation)

The obtained polyester was supplied into an extruder to be extruded into a sheet form on a rotating cooling drum having a temperature of 50° C. in a molten state from a die at 290° C. to obtain an unstretched film. This unstretched film was then stretched to 5.5 times in the machine direction (MD) by heating with an IR heater from above to ensure that the film surface temperature became 140° C. between two rollers having different revolving speeds installed in the machine direction to obtain a monoaxially oriented film. This monoaxially oriented film was guided to a stenter to be stretched to 6.0 times in the transverse direction (TD) at 140° C. and then heat set at 210° C. for 10 seconds to obtain a biaxially oriented film having a thickness of 7 μm. The characteristic properties of the obtained biaxially oriented polyester film are shown in Table 2.

Example 13

The procedure of Example 7 was repeated except that the temperature for stretching in the machine direction was changed to 135° C., the draw ratio in the machine direction was changed to 4.8 times, the temperature for stretching in the transverse direction was changed to 135° C., the draw ratio in the transverse direction was changed to 6.7 times and the heat setting temperature was changed to 190° C. to obtain a biaxially oriented film. The characteristic properties of the obtained biaxially oriented polyester film are shown in Table 2.

TABLE 2

| | Polymer | | | | | Young's modulus (Y) | | | Humidity expansion coefficient (αh) | | Temperature expansion coefficient (αt) | |
|---|---|---|---|---|---|---|---|---|---|---|---|---|
| | Acid component Type (mol %) | Glycol component Type (mol %) | Intrinsic viscosity dl/g | Melting point °C. | Tg °C. | MD GPa | TD GPa | Ratio | MD ×10⁻⁶/ % RH | TD ×10⁻⁶/ % RH | MD ×10⁻⁶/ °C. | TD ×10⁻⁶/ °C. |
| Ex. 7 | NA(73)/ENA(27) | EG(98)/DEG(2) | 0.66 | 240 | 117 | 6.7 | 6.4 | 1.0 | 5.0 | 5.3 | 4.7 | 6.1 |
| Ex. 8 | NA(73)/ENA(27) | EG(98)/DEG(2) | 0.66 | 240 | 117 | 5.5 | 7.1 | 1.3 | 5.5 | 4.4 | 9.7 | 4.7 |
| EX. 9 | NA(94)/ENA(6) | EG(99)/DEG(1) | 0.72 | 255 | 119 | 7.3 | 6.4 | 1.2 | 6.7 | 7.6 | 6.2 | 2.5 |
| Ex. 10 | NA(94)/ENA(6) | EG(99)/DEG(1) | 0.72 | 255 | 119 | 5.7 | 7.5 | 1.3 | 9.4 | 6.4 | 9.5 | −4.2 |
| Ex. 11 | NA(80)/ENA(20) | EG(99)/DEG(1) | 0.77 | 252 | 116 | 7.0 | 5.7 | 1.2 | 5.6 | 9.4 | 6.5 | 11.6 |
| EX. 12 | NA(65)/ENA(35) | EG(98)/DEG(2) | 0.77 | 247 | 116 | 5.5 | 8.4 | 1.5 | 5.0 | 3.8 | 10.5 | 0.1 |
| Ex. 13 | NA(73)/ENA(27) | EG(98)/DEG(2) | 0.66 | 240 | 117 | 5.3 | 9.0 | 1.6 | 6.7 | 4.3 | 8.7 | −3.1 |

Ex.: Example

Example 14

Polyester, NA(73)/ENA(27)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.66 dl/g and contained a 2,6-naphthalenedicarboxylic acid component in an amount of 73 mol % and a 6,6'-(ethylenedioxy) di-2-naphthoic acid component in an amount of 27 mol % of the total of all the acid components and an ethylene glycol component in an amount of 98 mol % and a diethylene glycol component in an amount of 2 mol % of the total of all the glycol components.

Silica particles having a volume shape factor (f) of 0.51 and an average particle diameter of 0.28 μm in the form of a ethylene glycol slurry were added to the polyester in an amount of 0.1 wt % based on the weight of the obtained resin composition before the polycondensation reaction. This polyester had a melting point of 240° C. and a glass transition temperature of 117° C., and the silica particles contained in the polymer were monodisperse particles in which 60% or more of the particles were dispersed as primary particles.

(Film Formation)

The obtained polyester was supplied into an extruder to be extruded into a sheet form on a rotating cooling drum having a temperature of 50° C. in a molten state from a die at 290° C. to obtain an unstretched film. This unstretched film was then stretched to 4.8 times in the machine direction (MD) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 7.7 times in the transverse direction (TD) at 140° C. and then heat set at 200° C. for 10 seconds to obtain a biaxially oriented film having a thickness of 6 μm. The characteristic properties of the obtained polyester composition and the biaxially oriented polyester film are shown in Table 3.

Example 15

The procedure of Example 14 was repeated except that silicone particles having a volume shape factor (f) of 0.50 and an average particle diameter of 0.5 μm were added in place of the silica particles and the amount of the particles was changed to 0.07 wt %. The silicone particles contained in the polymer were monodisperse particles in which 60% or more of the particles were dispersed as primary particles. The characteristic properties of the obtained polyester composition and the biaxially oriented polyester film are shown in Table 3.

Example 16

The procedure of Example 14 was repeated except that crosslinked polystyrene particles having a volume shape factor (f) of 0.48 and an average particle diameter of 0.7 μm were added in place of the silica particles and the amount of the particles was changed to 0.05 wt %. The crosslinked polystyrene particles contained in the polymer were monodisperse particles in which 60% or more of the particles were dispersed as primary particles. The characteristic properties of the obtained polyester composition and the biaxially oriented polyester film are shown in Table 3.

Example 17

The procedure of Example 14 was repeated except that silica particles having a volume shape factor (f) of 0.51 and an average particle diameter of 0.12 μm were added in place of the silica particles and the amount of the particles was changed to 0.5 wt %. The silica particles contained in the polymer were monodisperse particles in which 60% or more of the particles were dispersed as primary particles. The characteristic properties of the obtained polyester composition and the biaxially oriented polyester film are shown in Table 3.

Example 18

Polyester, NA(94)/ENA(6)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.72 dl/g and contained a 2,6-naphthalenedicarboxylic acid component in an amount of 94 mol % and a 6,6'-(ethylenedioxy)di-2-naphthoic acid component in an amount of 6 mol % of the total of all the acid components and an ethylene glycol component in an amount of 99 mol % and a diethylene glycol component in an amount of 1 mol % of the total of all the glycol components.

Silica particles having a volume shape factor (f) of 0.51 and an average particle diameter of 0.28 μm in the form of an ethylene glycol slurry were added to the polyester in an amount of 0.1 wt % based on the weight of the obtained resin composition before the polycondensation reaction. This polyester had a melting point of 255° C. and a glass transition temperature of 119° C. The silica particles contained in the polymer were monodisperse particles in which 60% or more of the particles were dispersed as primary particles.

(Film Formation)

The polyester obtained as described above was supplied into an extruder to be extruded into a sheet form on a rotating cooling drum having a temperature of 60° C. in a molten state from a die at 290° C. to obtain an unstretched film. This unstretched film was then stretched to 5.3 times in the machine direction (MD) by heating with an IR heater from above to ensure that the film surface temperature became 140° C. between two rollers having different revolving speeds installed in the machine direction to obtain a monoaxially oriented film. This monoaxially oriented film was guided to a stenter to be stretched to 4.0 times in the transverse direction (TD) at 140° C. and then heat set at 200° C. for 10 seconds to obtain a biaxially oriented film having a thickness of 8 μm. The characteristic properties of the obtained polyester composition and the biaxially oriented polyester film are shown in Table 3.

Example 19

Polyester, NA(80)/ENA(20)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.77 dl/g and contained a 2,6-naphthalenedicarboxylic acid component in an amount of 80 mol % and a 6,6'-(ethylenedioxy)di-2-naphthoic acid component in an amount of 20 mol % of the total of all the acid components and an ethylene glycol component in an amount of 99 mol % and a diethylene glycol component in an amount of 1 mol % of the total of all the glycol components.

Silica particles having a volume shape factor (f) of 0.51 and an average particle diameter of 0.28 μm in the form of an ethylene glycol slurry were added to the polyester in an amount of 0.1 wt % based on the weight of the obtained resin composition before the polycondensation reaction. This polyester had a melting point of 252° C. and a glass transition temperature of 116° C. The silica particles contained in the polymer were monodisperse particles in which 60% or more of the particles were dispersed as primary particles.

(Film Formation)

The obtained polyester was supplied into an extruder to be extruded into a sheet form on a rotating cooling drum having a temperature of 50° C. in a molten state from a die at 290° C. to obtain an unstretched film. This unstretched film was then stretched to 5.5 times in the machine direction (MD) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 4.3 times in the transverse direction (TD) at 140° C. and then heat set at 210° C. for 10 seconds to obtain a biaxially oriented film having a thickness of 6 μm. The characteristic properties of the obtained polyester composition and the biaxially oriented polyester film are shown in Table 3.

Example 20

Polyester, NA(65)/ENA(35)

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.77 dl/g and contained a 2,6-naphthalenedicarboxylic acid component in an amount of 65 mol % and a 6,6'-(ethylenedioxy)di-2-naphthoic acid component in an amount of 35 mol % of the total of all the acid components and an ethylene glycol component in an amount of 98 mol % and a diethylene glycol component in an amount of 2 mol % of the total of all the glycol components.

Silica particles having a volume shape factor (f) of 0.51 and an average particle diameter of 0.28 μm in the form of an ethylene glycol slurry were added to the polyester in an amount of 0.1 wt % based on the weight of the obtained resin composition before the polycondensation reaction. This polyester had a melting point of 247° C. and a glass transition temperature of 116° C. The silica particles contained in the polymer were monodisperse particles in which 60% or more of the particles were dispersed as primary particles.

(Film Formation)

The obtained polyester was supplied into an extruder to be extruded into a sheet form on a rotating cooling drum having a temperature of 50° C. in a molten state from a die at 290° C. to obtain an unstretched film. This unstretched film was then stretched to 5.5 times in the machine direction (MD) by heating with an IR heater from above to ensure that the film surface temperature became 140° C. between two rollers having different revolving speeds installed in the machine direction to obtain a monoaxially oriented film. This monoaxially oriented film was guided to a stenter to be stretched to 6.0 times in the transverse direction (TD) at 140° C. and then heat set at 210° C. for 10 seconds to obtain a biaxially oriented film having a thickness of 7 μm. The characteristic properties of the obtained polyester composition and the biaxially oriented polyester film are shown in Table 3.

Example 21

Polyester, TA(65)/ENA(35)

An esterification reaction and an ester interchange reaction were carried out among dimethyl terephthalate, 6,6'-(ethylenedioxy)di-2-naphthoic acid and ethylene glycol in the presence of titanium tetrabutoxide, and then a polycondensation reaction was carried out to obtain a polyester. The obtained polyester had an intrinsic viscosity of 0.73 dl/g and contained a terephthalic acid component in an amount of 65 mol % and a 6,6'-(ethylenedioxy)di-2-naphthoic acid component in an amount of 35 mol % of the total of all the acid components and an ethylene glycol component in an amount of 98.5 mol % and a diethylene glycol component in an amount of 1.5 mol % of the total of all the glycol components.

Silica particles having a volume shape factor (f) of 0.51 and an average particle diameter of 0.28 μm in the form of an ethylene glycol slurry were added to the polyester in an amount of 0.1 wt % based on the weight of the obtained resin composition before the polycondensation reaction. This polyester had a melting point of 233° C. and a glass transition temperature of 91° C. The silica particles contained in the polymer were monodisperse particles in which 60% or more of the particles were dispersed as primary particles.

(Film Formation)

The obtained polyester was supplied into an extruder to be extruded into a sheet form on a rotating cooling drum having a temperature of 40° C. in a molten state from a die at 290° C. to obtain an unstretched film. This unstretched film was then stretched to 4.0 times in the machine direction (MD) by heating with an IR heater from above to ensure that the film surface temperature became 110° C. between two rollers having different revolving speeds installed in the machine direction to obtain a monoaxially oriented film. This monoaxially oriented film was guided to a stenter to be stretched to 4.5 times in the transverse direction (TD) at 120° C. and then heat set at 210° C. for 3 seconds to obtain a biaxially oriented film having a thickness of 10 μm. The characteristic properties of the obtained polyester composition and the biaxially oriented polyester film are shown in Table 3.

Example 22

Polyester, TA(80)/ENA(20)

An esterification reaction and an ester interchange reaction were carried out among dimethyl terephthalate, 6,6'-(ethylenedioxy)di-2-naphthoic acid and ethylene glycol in the presence of titanium tetrabutoxide, and then a polycondensation reaction was carried out to obtain a polyester.

The obtained polyester had an intrinsic viscosity of 0.68 dl/g and contained a terephthalic acid component in an amount of 80 mol % and a 6,6'-(ethylenedioxy)di-2-naphthoic acid component in an amount of 20 mol % of the total of all the acid components and an ethylene glycol component in an amount of 98 mol % and a diethylene glycol component in an amount of 2 mol % of the total of all the glycol components.

Silica particles having a volume shape factor (f) of 0.51 and an average particle diameter of 0.28 m in the form of an ethylene glycol slurry were added to the polyester in an amount of 0.1 wt % based on the weight of the obtained resin composition before the polycondensation reaction. This polyester had a melting point of 230° C. and a glass transition temperature of 85° C. The silica particles contained in the polymer were monodisperse particles in which 60% or more of the particles were dispersed as primary particles.

(Film Formation)

The obtained polyester was supplied into an extruder to be extruded into a sheet form on a rotating cooling drum having a temperature of 30° C. in a molten state from a die at 290° C. to obtain an unstretched film. This unstretched film was then stretched to 5.0 times in the machine direction (MD) by heating with an IR heater from above to ensure that the film surface temperature became 105° C. between two rollers having different revolving speeds installed in the machine direction to obtain a monoaxially oriented film. This monoaxially oriented film was guided to a stenter to be stretched to 5.0 times in the transverse direction (TD) at 115° C. and then heat set at 210° C. for 3 seconds to obtain a biaxially oriented film having a thickness of 10 μm. The characteristic properties of the obtained polyester composition and the biaxially oriented polyester film are shown in Table 3.

Comparative Example 4

Polyester, NA(100)

An esterification reaction and an ester interchange reaction were carried out between dimethyl 2,6-naphthalene dicarboxylate and ethylene glycol in the presence of titanium tetrabutoxide, and then a polycondensation reaction was carried out to obtain a polyester. The obtained polyester had an intrinsic viscosity of 0.62 dl/g and contained a diethylene glycol component in an amount of 1.5 mol % of the total of all the glycol components.

Silica particles having a volume shape factor (f) of 0.51 and an average particle diameter of 0.28 μm in the form of an ethylene glycol slurry were added to the polyester in an amount of 0.1 wt % based on the weight of the obtained resin composition before the polycondensation reaction. This polyester had a melting point of 270° C. and a glass transition temperature of 120° C. The silica particles contained in the polymer were monodisperse particles in which 60% or more of the particles were dispersed as primary particles.

(Film Formation)

The obtained polyester was supplied into an extruder to be extruded into a sheet form on a rotating cooling drum having a temperature of 60° C. in a molten state from a die at 300° C. to obtain an unstretched film. This unstretched film was then stretched to 3.0 times in the machine direction (MD) by heating with an IR heater from above to ensure that the film surface temperature became 140° C. between two rollers having different revolving speeds installed in the machine direction to obtain a monoaxially oriented film. This monoaxially oriented film was guided to a stenter to be stretched to 4.3 times in the transverse direction (TD) at 140° C. and then heat set at 200° C. for 10 seconds to obtain a biaxially oriented film having a thickness of 10 μm. The characteristic properties of the obtained polyester composition and the biaxially oriented polyester film are shown in Table 3.

Comparative Example 5

The procedure of Comparative Example 4 was repeated except that the temperature for stretching in the machine direction was changed to 140° C., the draw ratio in the machine direction was changed to 4.0 times, the temperature for stretching in the transverse direction was changed to 140° C., the draw ratio in the transverse direction was changed to 5.5 times and the heat setting temperature was changed to 200° C. to obtain a biaxially oriented film. The characteristic properties of the obtained polyester composition and the biaxially oriented polyester film are shown in Table 3.

Comparative Example 6

The procedure of Comparative Example 4 was repeated except that the temperature for stretching in the machine direction was changed to 140° C., the draw ratio in the machine direction was changed to 4.5 times, the temperature for stretching in the transverse direction was changed to 140° C., the draw ratio in the transverse direction was changed to 3.4 times and the heat setting temperature was changed to 200° C. to obtain a biaxially oriented film. The characteristic properties of the obtained polyester composition and the biaxially oriented polyester film are shown in Table 3.

TABLE 3

| | Polymer | | Particles | | | | Young's modulus | | $\alpha h$ TD | $\alpha t$ TD | Void |
|---|---|---|---|---|---|---|---|---|---|---|---|
| | Acid component | Glycol component | | | Average particle | | | | | | |
| | Type (number of moles) | Type (number of moles) | Type | f | diameter μm | Content wt % | MD GPa | TD GPa | $\times 10^{-6}/$ % RH | $\times 10^{-6}/$ ° C. | ratio |
| Ex. 14 | NA(73)/ENA(27) | EG(98)/DEG(2) | Silica | 0.51 | 0.28 | 0.1 | 5.5 | 9.5 | 3.6 | −4.2 | 1.6 |
| Ex. 15 | NA(73)/ENA(27) | EG(98)/DEG(2) | Silicone | 0.5 | 0.5 | 0.07 | 5.5 | 9.5 | 3.6 | −4.2 | 1.5 |
| Ex. 16 | NA(73)/ENA(27) | EG(98)/DEG(2) | Crosslinked polystyrene | 0.48 | 0.7 | 0.05 | 5.5 | 9.5 | 3.6 | −4.2 | 1.4 |
| Ex. 17 | NA(73)/ENA(27) | EG(98)/DEG(2) | Silica | 0.51 | 0.12 | 0.5 | 5.5 | 9.5 | 3.6 | −4.2 | 1.6 |
| Ex. 18 | NA(94)/ENA(6) | EG(99)/DEG(1) | Silica | 0.51 | 0.28 | 0.1 | 7.3 | 6.4 | 7.6 | 2.5 | 2.8 |
| Ex. 19 | NA(80)/ENA(20) | EG(99)/DEG(1) | Silica | 0.51 | 0.28 | 0.1 | 7.0 | 5.7 | 9.4 | 11.6 | 1.4 |
| Ex. 20 | NA(65)/ENA(35) | EG(98)/DEG(2) | Silica | 0.51 | 0.28 | 0.1 | 5.5 | 8.4 | 3.8 | 0.1 | 1.5 |
| Ex. 21 | TA(65)/ENA(35) | EG(98.5)/DEG(1.5) | Silica | 0.51 | 0.28 | 0.1 | 2.7 | 8.0 | 3.5 | 2.9 | 1.2 |
| Ex. 22 | TA(80)/ENA(20) | EG(98)/DEG(2) | Silica | 0.51 | 0.28 | 0.1 | 4.9 | 4.8 | 8.0 | 13.8 | 1.4 |
| C. Ex. 4 | NA(100) | EG(98.5)/DEG(1.5) | Silica | 0.51 | 0.28 | 0.1 | 5.5 | 9.5 | 8.6 | −3.8 | 3.0 |
| C. Ex. 5 | NA(100) | EG(98.5)/DEG(1.5) | Silica | 0.51 | 0.28 | 0.1 | 5.5 | 8.0 | 10.0 | −1.0 | 5.1 |
| C. Ex. 6 | NA(100) | EG(98.5)/DEG(1.5) | Silica | 0.51 | 0.28 | 0.1 | 9.2 | 5.7 | 13.5 | 13.5 | 3.6 |

Ex.: Example
C. Ex.: Comparative Example

Example 23

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain an aromatic polyester having an intrinsic viscosity of 0.66 dl/g and comprising a 2,6-naphthalenedicarboxylic acid component in an amount of 73 mol % and a 6,6'-(ethylenedioxy)di-2-naphthoic acid component in an amount of 27 mol % of the total of all the acid components and an ethylene glycol component in an amount of 98 mol % and a diethylene glycol component in an amount of 2 mol % of the total of all the glycol components. Silica particles having an average particle diameter of 0.5 μm were contained in the aromatic polyester in an amount of 0.2 wt % based on the weight of the obtained resin composition before the polycondensation reaction. This aromatic polyester had a melting point of 240° C. and a glass transition temperature of 117° C.

The aromatic polyester obtained as described above was supplied into an extruder to be extruded into a sheet form on a rotating cooling drum having a temperature of 50° C. in a molten state from a die at 290° C. to obtain an unstretched film. This unstretched film was then stretched to 4.5 times in the longitudinal direction (machine direction) by heating with an IR heater from above to ensure that the film surface temperature became 130° C. between two rollers having different revolving speeds installed in the machine direction to obtain a monoaxially oriented film. This monoaxially oriented film was guided to a stenter to be stretched to 7.5 times in the transverse direction (width direction) at 130° C. and then heat set at 180° C. for 10 seconds to obtain a biaxially oriented film having a thickness of 5 μm. The characteristic properties of the obtained biaxially oriented polyester film are shown in Table 4.

Example 24

The procedure of Example 23 was repeated except that the draw ratio in the longitudinal direction (machine direction) was changed to 5.7 times, the draw ratio in the transverse direction (width direction) was changed to 7.7 times, heat setting was carried out at 190° C. for 10 seconds and the thickness of the unstretched film was changed to ensure that the thickness of the obtained film became 5 μm. The characteristic properties of the obtained biaxially oriented polyester film are shown in Table 4.

Example 25

The procedure of Example 23 was repeated except that the draw ratio in the longitudinal direction (machine direction) was changed to 6.0 times, the draw ratio in the transverse direction (width direction) was changed to 8.5 times, heat setting was carried out at 195° C. for 10 seconds and the thickness of the unstretched film was changed to ensure that the thickness of the obtained film became 4.5 μm. The characteristic properties of the obtained biaxially oriented polyester film are shown in Table 4.

Example 26

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain an aromatic polyester having an intrinsic viscosity of 0.66 dl/g and comprising a 2,6-naphthalenedicarboxylic acid component in an amount of 76 mol % and a 6,6'-(ethylenedioxy)di-2-naphthoic acid component in an amount of 24 mol of the total of all the acid components and an ethylene glycol component in an amount of 98 mol % and a diethylene glycol component in an amount of 2 mol % of the total of all the glycol components. Silica particles having an average particle diameter of 0.5 μm were contained in the aromatic polyester in an amount of 0.2 wt % based on the weight of the obtained resin composition before the polycondensation reaction. This aromatic polyester had a melting point of 243° C. and a glass transition temperature of 117° C.

The aromatic polyester obtained as described above was supplied into an extruder to be extruded into a sheet form on a rotating cooling drum having a temperature of 50° C. in a molten state from a die at 290° C. to obtain an unstretched film. This unstretched film was then stretched to 6.0 times in the longitudinal direction (machine direction) by heating with an IR heater from above to ensure that the film surface temperature became 130° C. between two rollers having different revolving speeds installed in the machine direction to obtain a monoaxially oriented film. This monoaxially oriented film was guided to a stenter to be stretched to 8.4 times in the transverse direction (width direction) at 130° C. and then heat set at 195° C. for 10 seconds to obtain a biaxially oriented film having a thickness of 4.5 μm. The characteristic properties of the obtained biaxially oriented polyester film are shown in Table 4.

Example 27

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain an aromatic polyester having an intrinsic viscosity of 0.66 dl/g and comprising a 2,6-naphthalenedicarboxylic acid component in an amount of 82 mol % and a 6,6'-(ethylenedioxy)di-2-naphthoic acid component in an amount of 18 mol % of the total of all the acid components and an ethylene glycol component in an amount of 98 mol % and a diethylene glycol component in an amount of 2 mol % of the total of all the glycol components. Silica particles having an average particle diameter of 0.5 μm were contained in the aromatic polyester in an amount of 0.2 wt % based on the weight of the obtained resin composition before the polycondensation reaction. This aromatic polyester had a melting point of 249° C. and a glass transition temperature of 118° C.

The aromatic polyester obtained as described above was supplied into an extruder to be extruded into a sheet form on a rotating cooling drum having a temperature of 50° C. in a molten state from a die at 290° C. to obtain an unstretched film. This unstretched film was then stretched to 5.0 times in the longitudinal direction (machine direction) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 8.4 times in the transverse direction (width direction) at 135° C. and then heat set at 203° C. for 10 seconds to obtain a biaxially oriented film having a thickness of 5 μm. The characteristic properties of the obtained biaxially oriented polyester film are shown in Table 4.

Example 28

The procedure of Example 27 was repeated except that the draw ratio in the longitudinal direction (machine direction)

was changed to 4.9 times, the draw ratio in the transverse direction (width direction) was changed to 8.0 times, heat setting was carried out at 203° C. for 10 seconds and the thickness of the unstretched film was changed to ensure that the thickness of the obtained film became 5 μm. The characteristic properties of the obtained biaxially oriented polyester film are shown in Table 4.

Example 29

The procedure of Example 27 was repeated except that the draw ratio in the longitudinal direction (machine direction) was changed to 5.0 times, the draw ratio in the transverse direction (width direction) was changed to 7.6 times, heat setting was carried out at 203° C. for 10 seconds and the thickness of the unstretched film was changed to ensure that the thickness of the obtained film became 4.5 μm. The characteristic properties of the obtained biaxially oriented polyester film are shown in Table 4.

Example 30

The procedure of Example 27 was repeated except that the draw ratio in the longitudinal direction (machine direction) was changed to 5.0 times, the draw ratio in the transverse direction (width direction) was changed to 7.9 times, heat setting was carried out at 203° C. for 10 seconds and the thickness of the unstretched film was changed to ensure that the thickness of the obtained film became 5.0 μm. The characteristic properties of the obtained biaxially oriented polyester film are shown in Table 4.

Example 31

An esterification reaction and an ester interchange reaction were carried out among dimethyl 2,6-naphthalene dicarboxylate, 6,6'-(ethylenedioxy)di-2-naphthoic acid and ethylene glycol in the presence of titanium tetrabutoxide, and then a polycondensation reaction was carried out to obtain an aromatic polyester having an intrinsic viscosity of 0.66 dl/g and comprising a 2,6-naphthalenedicarboxylic acid component in an amount of 85 mol % and a 6,6'-(ethylenedioxy)di-2-naphthoic acid component in an amount of 15 mol % of the total of all the acid components and an ethylene glycol component in an amount of 98 mol % and a diethylene glycol component in an amount of 2 mol % of the total of all the glycol components. Silica particles having an average particle diameter of 0.5 μm were contained in the aromatic polyester in an amount of 0.2 wt % based on the weight of the obtained resin composition before the polycondensation reaction. This aromatic polyester had a melting point of 252° C. and a glass transition temperature of 118° C.

The aromatic polyester obtained as described above was supplied into an extruder to be extruded into a sheet form on a rotating cooling drum having a temperature of 55° C. in a molten state from a die at 290° C. to obtain an unstretched film. This unstretched film was then stretched to 5.0 times in the longitudinal direction (machine direction) by heating with an IR heater from above to ensure that the film surface temperature became 135° C. between two rollers having different revolving speeds installed in the machine direction to obtain a monoaxially oriented film. This monoaxially oriented film was guided to a stenter to be stretched to 8.1 times in the transverse direction (width direction) at 140° C. and then heat set at 205° C. for 10 seconds to obtain a biaxially oriented film having a thickness of 4.5 μm.

The characteristic properties of the obtained biaxially oriented polyester film are shown in Table 4.

Example 32

The procedure of Example 31 was repeated except that the draw ratio in the longitudinal direction (machine direction) was changed to 5.3 times, the draw ratio in the transverse direction (width direction) was changed to 8.0 times, heat setting was carried out at 205° C. for 10 seconds and the thickness of the unstretched film was changed to ensure that the thickness of the obtained film became 5 μm. The characteristic properties of the obtained biaxially oriented polyester film are shown in Table 4.

TABLE 4

| | Polymer | | | | | Young's modulus (Y) | | | Humidity expansion coefficient (αh) | | Temperature expansion coefficient (αt) | |
|---|---|---|---|---|---|---|---|---|---|---|---|---|
| | Acid component Type (mol %) | Glycol component Type (mol %) | Intrinsic viscosity dl/g | Melting point ° C. | Tg ° C. | MD GPa | TD GPa | Ratio | MD ×10⁻⁶/ % RH | TD ×10⁻⁶/ % RH | MD ×10⁻⁶/ ° C. | TD ×10⁻⁶/ ° C. |
| Ex. 23 | NA(73)/ ENA(27) | EG(98)/ DEG(2) | 0.54 | 240 | 117 | 5.2 | 9.9 | 1.9 | 6.4 | 3.9 | 10.0 | −4.3 |
| Ex. 24 | NA(73)/ ENA(27) | EG(98)/ DEG(2) | 0.54 | 240 | 117 | 6.1 | 8.5 | 1.4 | 5.8 | 4.5 | 7.2 | 0.0 |
| Ex. 25 | NA(73)/ ENA(27) | EG(98)/ DEG(2) | 0.53 | 240 | 117 | 5.7 | 9.6 | 1.7 | 6.0 | 4.0 | 8.5 | −3.4 |
| Ex. 26 | NA(76)/ ENA(24) | EG(98)/ DEG(2) | 0.52 | 240 | 117 | 5.8 | 8.5 | 1.5 | 6.9 | 5.1 | 8.2 | 0.0 |
| Ex. 27 | NA(82)/ ENA(18) | EG(98)/ DEG(2) | 0.55 | 249 | 117 | 5.8 | 9.7 | 1.7 | 8.4 | 5.5 | 8.2 | −3.7 |
| Ex. 28 | NA(82)/ ENA(18) | EG(98)/ DEG(2) | 0.53 | 249 | 117 | 5.8 | 10.2 | 1.8 | 8.4 | 5.1 | 8.2 | −5.2 |
| Ex. 29 | NA(82)/ ENA(18) | EG(98)/ DEG(2) | 0.54 | 249 | 117 | 5.8 | 8.9 | 1.5 | 8.4 | 5.9 | 8.2 | −1.2 |
| Ex. 30 | NA(82)/ ENA(18) | EG(98)/ DEG(2) | 0.55 | 249 | 117 | 6.1 | 9.4 | 1.5 | 8.0 | 5.6 | 7.2 | −2.8 |
| Ex. 31 | NA(85)/ ENA(15) | EG(98)/ DEG(2) | 0.55 | 252 | 118 | 5.8 | 9.7 | 1.7 | 9.2 | 5.9 | 8.2 | −3.7 |
| Ex. 32 | NA(85)/ ENA(15) | EG(98)/ DEG(2) | 0.55 | 252 | 118 | 6.3 | 8.4 | 1.3 | 8.6 | 6.6 | 6.6 | 0.3 |

Ex.: Example

Reference Example 1

Manufacture of bis(β-hydroxyethyl)6,6'-(ethylenedioxy)di-2-naphthoic acid 100 parts by weight of 6,6'-(ethylenedioxy)di-2-naphthoic acid, 62 parts by weight of ethylene glycol and 0.085 part by weight of tetra-n-butyl titanate were charged into an autoclave equipped with a 1-liter stirrer and a nitrogen gas introduction port, the inside of the autoclave was substituted by nitrogen, and a nitrogen pressure of 0.2 MPa was applied to carry out a reaction at 230° C. for 6 hours. A crystal which separated out after the reaction was filtered and washed with methanol. After washing, the crystal was dried in vacuum at 120° C. to obtain 115 parts by weight of bis(β-hydroxyethyl) 6,6'-(ethylenedioxy)di-2-naphthoic acid. This had an esterification rate of 96%. Its melting point was 240° C.

Example 33

NA(87.4)/ENA(12.6)

100 parts by weight of the bis(β-hydroxyethyl)6,6'-(ethylenedioxy)di-2-naphthoic acid obtained in Reference Example 1, 352 parts by weight of 2,6-bis(hydroxyethoxycarbonyl)naphthalene and 0.09 part by weight of tetra-n-butyl titanate were charged into a reactor equipped with a fractionating tower and molten at 270° C. in a nitrogen atmosphere. Thereafter, the pressure was gradually reduced to carry out a reaction at 500 mmHg for about 20 minutes under agitation, and the polymerization temperature was raised to 320° C. Then, the inside of the system was further gradually reduced to 0.2 mmHg to carry out the reaction for about 20 minutes under agitation so as to obtain copolyethylene-2,6-naphthalate comprising a naphthalenedicarboxylic acid component in an amount of 87.4 mol % and a 6,6'-(ethylenedioxy)di-2-naphthoic acid component in an amount of 12.6 mol %. The obtained polymer had an intrinsic viscosity of 0.98, a glass transition temperature of 115° C. and a melting point of 238° C. The physical properties of the obtained polymer are shown in Tables 5 and 6.

Figure 2:
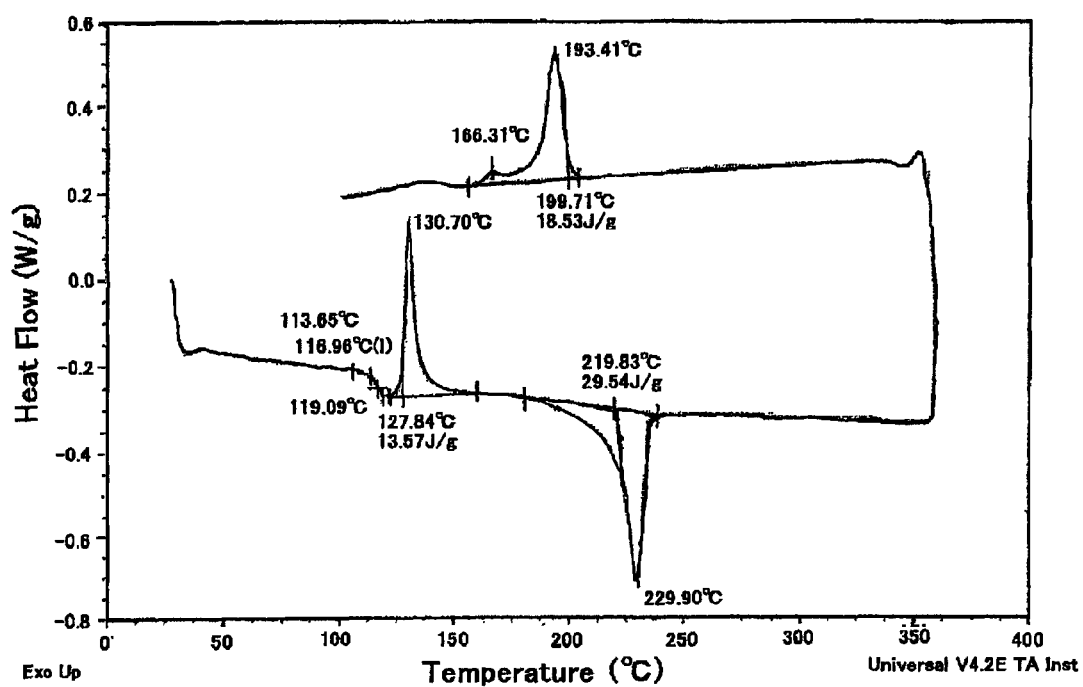
FIG. 2 is a DSC measurement chart of copolyethylene-2,6-naphthalate in Example 33.

No peak was seen at a 2θ of 5 to 10° in the XRD measurement of the obtained copolyethylene-2,6-naphthalate (FIG. 1). No heat absorption peak was seen at 120 to 220° C. in the DSC measurement of the obtained copolyethylene-2,6-naphthalate when it was cooled at a rate of 10° C./min after it was heated up to 320° C. at a temperature elevation rate of 20° C./min (FIG. 2).

Example 34

NA(69.5)/ENA(30.5)

Figure 3:
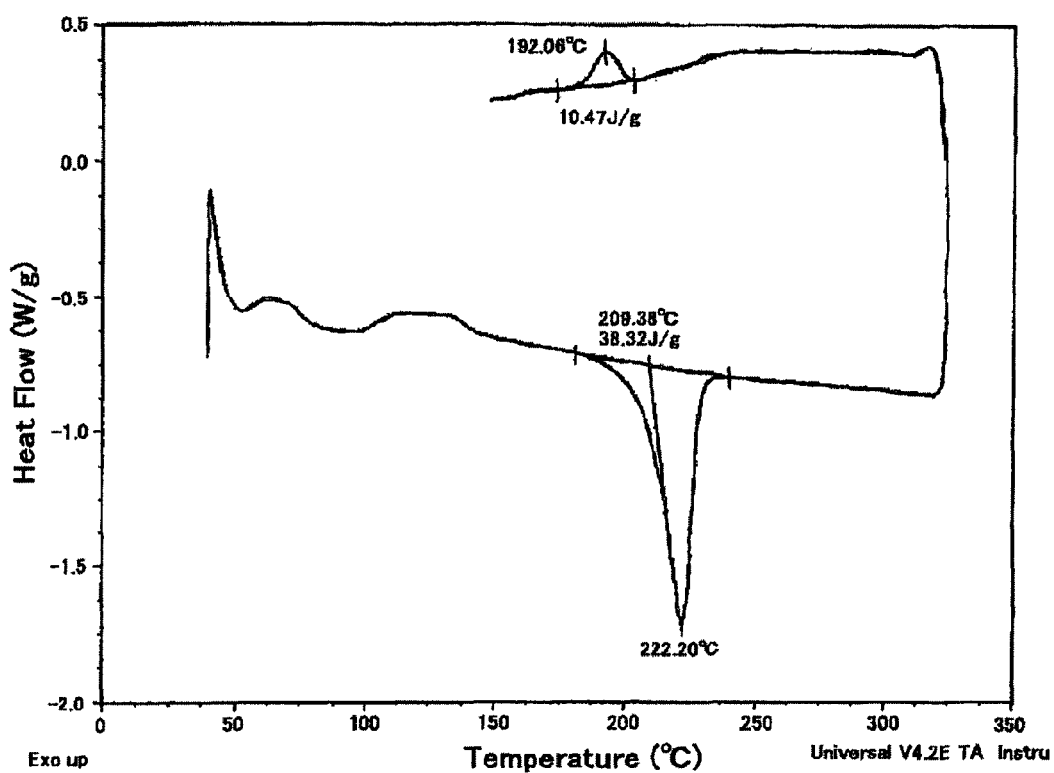
FIG. 3 is a DSC measurement chart of copolyethylene-2,6-naphthalate in Example 34.

Copolyethylene-2,6-naphthalate comprising a naphthalenedicarboxylic acid component in an amount of 69.5 mol % and a 6,6'-(ethylenedioxy)di-2-naphthoic acid component in an amount of 30.5 mol % was obtained in the same manner as in Example 1 except that 100 parts by weight of 6,6'-(ethylenedioxy)di-2-naphthoic acid and 145 parts by weight of 2,6-bis(hydroxyethoxycarbonyl)naphthalene were used. The physical properties of the obtained polymer are shown in Tables 5 and 6. No peak was seen at a 2θ of 5 to 10° in the XRD measurement of the obtained copolyethylene-2,6-naphthalate. One heat absorption peak was seen in the DSC measurement of the obtained copolyethylene-2,6-naphthalate when it was cooled at a rate of 10° C./min after it was heated up to 320° C. at a temperature elevation rate of 20° C./min (FIG. 3).

Example 35

NA(62.3)/ENA(37.7)

Figure 4:
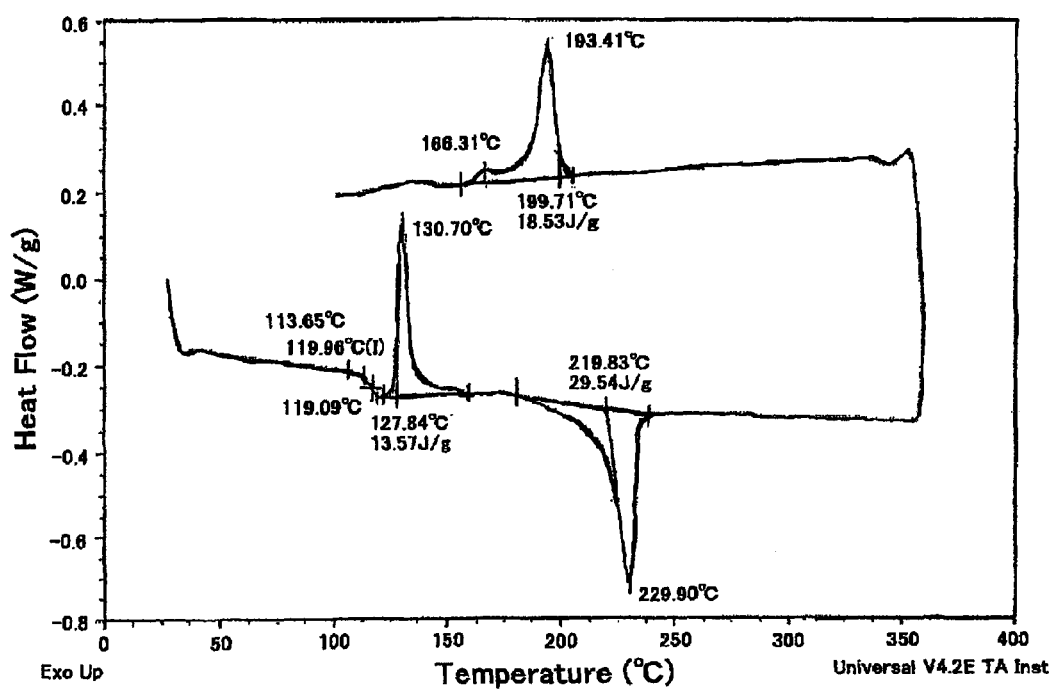
FIG. 4 is a DSC measurement chart of copolyethylene-2,6-naphthalate in Example 35.

Copolyethylene-2,6-naphthalate comprising a naphthalenedicarboxylic acid component in an amount of 62.3 mol % and a 6,6'-(ethylenedioxy)di-2-naphthoic acid component in an amount of 37.7 mol % was obtained in the same manner as in Example 33 except that 100 parts by weight of 6,6'-(ethylenedioxy)di-2-naphthoic acid and 93 parts by weight of 2,6-bis(hydroxyethoxycarbonyl)naphthalene were used. The physical properties of the obtained polymer are shown in Tables 5 and 6. No peak was seen at a 2θ of 5 to 10° in the XRD measurement of the obtained copolyethylene-2,6-naphthalate. One main heat absorption peak and one small heat absorption peak were seen in the DSC measurement of the obtained copolyethylene-2,6-naphthalate when it was cooled at a rate of 10° C./min after it was heated up to 320° C. at a temperature elevation rate of 20° C./min (FIG. 4).

TABLE 5

| | Amount of NMR | | Tg | Tm | | DSC Heat absorption peak 1 at the time of cooling | | Heat absorption peak 2 at the time of cooling | |
|---|---|---|---|---|---|---|---|---|---|
| | mol % | η sp/c | (° C.) | (° C.) | (J/g) | (° C.) | (J/g) | (° C.) | (J/g) |
| Example 33 | 87.4 | 0.62 | 115 | 238 | 2.306 | — | — | — | — |
| Example 34 | 69.5 | 0.87 | 114 | 222 | 38.32 | 192.06 | 10.47 | — | — |
| Example 35 | 62.3 | 0.98 | 117 | 230 | 29.54 | 193.41 | 18.53 | 166.31 | Very small |

TABLE 6

| | NMR | | |
| --- | --- | --- | --- |
| | Amount of COOH terminal (eq/Ton) | Amount of OH terminal (eq/Ton) | DEG mol % |
| Example 33 | Very small | 89.4 | 6 |
| Example 34 | 73.5 | 34.5 | 7.2 |
| Example 35 | 43.2 | 44.6 | 5.3 |

Example 36

NA(73)/ENA(27)

Copolyethylene-2,6-naphthalate comprising a naphthalenedicarboxylic acid component in an amount of 73 mol % and a 6,6'-(ethylenedioxy)di-2-naphthoic acid component in an amount of 27 mol % was obtained in the same manner as in Example 1 except that 100 parts by weight of 6,6'-(ethylenedioxy)di-2-naphthoic acid and 168 parts by weight of 2,6-bis(hydroxyethoxycarbonyl)naphthalene were used.

The obtained copolyethylene-2,6-naphthalate was supplied into an extruder to be extruded into a sheet form on a rotating cooling drum having a temperature of 40° C. in a molten state from a die at 290° C. to obtain an unstretched film. This unstretched film was then stretched at a draw ratio specified in the table in the longitudinal direction (machine direction) by heating with an IR heater from above to ensure that the film surface temperature became 140° C. between two rollers having different revolving speeds installed in the machine direction. The film was then stretched in the transverse direction (width direction) at 140° C. to obtain a maximum draw ratio until it was broken (maximum draw ratio up to 6 times was measured and no further draw ratio was measured). The film was then stretched in the transverse direction (width direction) at a draw ratio smaller than the maximum draw ratio before it was broken to obtain a film having a thickness of 8 μm so as to calculate the area ratio from the substantial draw ratios in the longitudinal direction and the transverse direction. The film was heat set at 185° C. for 10 seconds, and the characteristic properties of the obtained biaxially oriented polyester film are shown in Table 7.

Comparative Example 7

NA(100)

An esterification reaction and an ester interchange reaction were carried out between dimethyl 2,6-naphthalene dicarboxylate and ethylene glycol in the presence of titanium tetrabutoxide, and then a polycondensation reaction was carried out to obtain polyethylene-2,6-naphthalate having an intrinsic viscosity of 0.62 dl/g and comprising a diethylene glycol component in an amount of 1.5 mol % of the total of all the glycol components. This was stretched at draw ratios specified in Table 7 in the same manner as in Example 36 to obtain a biaxially oriented polyester film, and the characteristic properties of the obtained biaxially oriented polyester film are shown in Table 7.

TABLE 7

| | | Example 36 | | | Comparative Example 7 | | |
| --- | --- | --- | --- | --- | --- | --- | --- |
| Amount | (mol %) | 73 | | | 100 | | |
| ηsp/c | | 0.9 | | | 0.8 | | |
| Tg | (° C.) | 114 | | | 120 | | |
| Tm | (° C.) | 220 | | | 270 | | |
| Draw ratio in longitudinal direction | (times) | 4.2 | 5.1 | 6.0 | 3.2 | 3.0 | 3.5 |
| Maximum draw ratio in transverse direction | (times) | 6.0 | 5.8 | 5.6 | 4.9 | 4.4 | 3.3 |
| Draw ratio in transverse direction | (times) | 5.0 | 4.7 | 4.0 | 3.8 | 3.4 | 2.9 |
| Area draw ratio | | 21.0 | 24.0 | 24.0 | 12.2 | 10.2 | 10.2 |
| Heat setting temperature | (° C.) | 185 | 185 | 185 | 200 | 200 | 200 |
| Young's modulus (MD) | GPa | 555 | 616 | 678 | 546 | 551 | 679 |
| Young's modulus (TD) | GPa | 950 | 677 | 608 | 858 | 676 | 599 |
| αt (TD) | $\times 10^{-6}$/% RH | −4.26 | 3.94 | 6.48 | 0.03 | 4.4 | 8.22 |
| αh (TD) | $\times 10^{-6}$/° C. | 4.0 | 5.4 | 6.4 | 9.4 | 10.4 | 12.0 |

Examples 37 to 39

Copolyethylene-2,6-naphthalate comprising a naphthalenedicarboxylic acid component in an amount shown in Table 8 was obtained in the same manner as in Example 33, films having a thickness of 8 to 10 μm were obtained in the same manner as in Example 36, and biaxially oriented films were formed and evaluated. The results are shown in Table 8.

TABLE 8

| | | Example 37 | Example 38 | Example 39 |
| --- | --- | --- | --- | --- |
| Amount | (mol %) | 80 | 65 | 57 |
| ηsp/c | | 0.90 | 0.92 | 0.95 |
| Tg | (° C.) | 115 | 113 | 111 |

TABLE 8-continued

| | | Example 37 | | | Example 38 | | | Example 39 | | |
|---|---|---|---|---|---|---|---|---|---|---|
| Tm | (° C.) | | 227 | | | 225 | | | 233 | |
| Draw ratio in longitudinal direction | (times) | 4.2 | 5.1 | 6.0 | 3.8 | 4.5 | 5.8 | 3.5 | 4.5 | 5.5 |
| Maximum draw ratio in transverse direction | (times) | 6.0 | 5.8 | 5.6 | 6.0 | 6.0 | 6.0 | 6.0 | 5.9 | 4.4 |
| Draw ratio in transverse direction | (times) | 5.0 | 4.7 | 4.0 | 7.8 | 8.0 | 9.3 | 6.7 | 6.3 | 6.5 |
| Area draw ratio | | 21.0 | 24.0 | 24.0 | 29.6 | 36.0 | 53.9 | 23.5 | 28.4 | 35.8 |
| Heat setting temperature | (° C.) | 190 | 190 | 190 | 205 | 205 | 205 | 195 | 195 | 195 |
| Young's modulus (MD) | GPa | 578 | 581 | 830 | 387 | 422 | 423 | 353 | 434 | 537 |
| Young's modulus (TD) | GPa | 844 | 669 | 536 | 1209 | 1231 | 971 | 951 | 967 | 492 |
| αt (TD) | ×10$^{-6}$/% RH | 1.31 | 8.26 | 15.08 | −7.33 | −5.05 | −5.38 | −5.61 | −2.95 | 12.59 |
| αh (TD) | ×10$^{-6}$/° C. | 6.2 | 8.1 | 8.6 | 2.4 | 2.5 | 2.9 | 3.3 | 3.2 | 5.2 |

EFFECT OF THE INVENTION

The polyester of the present invention can provide a film having excellent mechanical strength and dimensional stability. Since the polyester of the present invention has excellent film forming properties, it is a raw material for a film having excellent physical properties.

The film of the present invention has a low temperature expansion coefficient (αt) and a low humidity expansion coefficient (αh) and is therefore excellent in dimensional stability to environmental variations such as temperature and humidity variations. The film of the present invention has a high Young's modulus and excellent mechanical strength.

INDUSTRIAL APPLICABILITY

The film of the present invention has excellent dimensional stability and can be advantageously used in fields in which dimensional stability is required, such as a base film for high-density magnetic recording media.

The polyester, polyester composition and film of the present invention can also be advantageously used not only as a base film for high-density magnetic recording media but also in fields in which dimensional stability to environmental variations is required, such as heat ray reflection films, optical films such as reflectors, polarizers and protective films thereof in a solar cell or a liquid crystal display, films having a flexible display or a transparent conductive (semiconductor film) layer, films for circuit substrates such as flexible printed circuit boards, films for electrical insulation such as fuel cells and capacitors, films to be laminated with a metal due to excellent stretchability and films for molding such as in-mold transfer molding.

The invention claimed is:

1. A polyester containing a dicarboxylic acid component and a diol component, wherein (i) the dicarboxylic acid component contains not less than 5 mol % and less than 50 mol % of a recurring unit represented by the following formula (A) and more than 50 mol % and not more than 95 mol % of a recurring unit represented by the following formula (B):

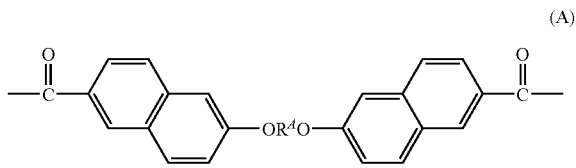
(A)

wherein $R^A$ is an alkylene group having 2 to 10 carbon atoms,

(B)

wherein $R^B$ is a phenylene group or naphthalenediyl group; and (ii) the diol component contains 90 to 100 mol % of a recurring unit represented by the following formula (C):

(C)

wherein $R^C$ is an alkylene group having 2 to 10 carbon atoms.

2. The polyester according to claim 1, wherein the recurring unit represented by the formula (A) is a recurring unit represented by the following formula (A-1)

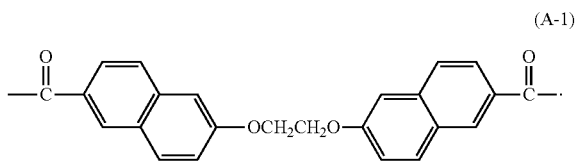
(A-1)

3. The polyester according to claim 1, wherein the dicarboxylic acid component contains 10 to 40 mol % of the recurring unit represented by the formula (A) and 90 to 60 mol % of a recurring unit represented by the following formula (B-1)

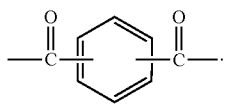 (B-1)

4. The polyester according to claim 1, wherein the dicarboxylic acid component contains 5 to 45 mol % of the recurring unit represented by the formula (A) and 95 to 55 mol % of a recurring unit represented by the following formula (B-2)

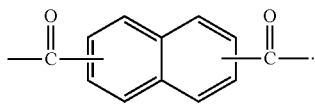 (B-2)

5. The polyester according to claim 1 which has an intrinsic viscosity measured at 35° C. by using a mixed solvent of p-chlorophenol and 1,1,2,2-tetrachloroethane (weight ratio of 40/60) of 0.4 to 3.

6. The polyester according to claim 1 which has a melting point of 200 to 260° C.

7. The polyester according to claim 4, wherein no peak is seen at a 2θ of 5 to 10° in the XRD measurement of an amorphous product prepared by melting the polyester at 340° C. and quenching it in an iced bath.

8. The polyester according to claim 4, wherein zero to one heat absorption peak is seen at 120 to 220° C. in the DSC measurement of the polyester when the polyester is cooled at a rate of 10° C./min after it is heated up to 320° C. at a temperature elevation rate of 20° C./min.

9. A film containing the polyester of claim 1.

10. The film according to claim 9 which has a Young's modulus (Y) in at least one direction in the plane direction of the film of not less than 4.5 GPa.

11. The film according to claim 9 which has a Young's modulus (Y) in at least one direction in the plane direction of the film of not less than 6 GPa.

12. The film according to claim 9 which has Young's moduli in two crossing directions in the plane direction of the film of not less than 5 GPa.

13. The film according to claim 9 which has a temperature expansion coefficient ($\alpha t$) in at least one direction in the plane direction of the film of not more than $14 \times 10^{-6}$/° C.

14. The film according to claim 9 which has a temperature expansion coefficient ($\alpha t$) in at least one direction in the plane direction of the film of not more than $10 \times 10^{-6}$/° C.

15. The film according to claim 9 which has a temperature expansion coefficient ($\alpha t$) in the transverse direction in the plane direction of the film of not more than $14 \times 10^{-6}$/° C.

16. The film according to claim 9 which has a temperature expansion coefficient ($\alpha t$) in the transverse direction in the plane direction of the film of not more than $10 \times 10^{-6}$/° C.

17. The film according to claim 9 which has a humidity expansion coefficient ($\alpha h$) in at least one direction in the plane direction of the film of 1 to $7 \times 10^{-6}$/% RH.

18. The film according to claim 9, wherein the Young's modulus and the humidity expansion coefficient ($\alpha h$) in at least one direction in the plane direction of the film satisfy the following expression (1):

$$\alpha h < -1.2Y + 17 \quad (1)$$

(wherein the unit of $\alpha h$ is $10^{-6}$/% RH and the unit of Y is GPa).

19. The film according to claim 9 which is used as a base film for a magnetic recording medium.

20. The film according to claim 19, wherein the magnetic recording medium is a high-density magnetic recording tape of a linear recording system.

21. A composition containing the polyester of claim 1 and particles having an average particle diameter of 0.05 to 5 μm.

22. The composition according to claim 21, wherein the content of the particles is 0.01 to 50 wt % based on the weight of the composition.

23. The composition according to claim 21, wherein the particles have a volume shape factor of 0.4 to π/6.

24. The composition according to claim 21, wherein the particles are of at least one type selected from the group consisting of silica particles and organic polymer particles.

25. The composition according to claim 21, wherein the particles are of at least one type selected from the group consisting of silicone resin particles and crosslinked polystyrene particles.

* * * * *